(12) United States Patent
Liao

(10) Patent No.: US 10,950,996 B2
(45) Date of Patent: Mar. 16, 2021

(54) MULTIPLEX CONNECTING DEVICE CAPABLE OF SWITCHING AN OPERABILITY OF A SINGLE CONNECTOR THEREOF

(71) Applicant: Sheng-Hsin Liao, New Taipei (TW)

(72) Inventor: Sheng-Hsin Liao, New Taipei (TW)

(*) Notice: Subject to any disclaimer, the term of this patent is extended or adjusted under 35 U.S.C. 154(b) by 0 days.

(21) Appl. No.: 16/822,022

(22) Filed: Mar. 18, 2020

(65) Prior Publication Data
US 2020/0303885 A1    Sep. 24, 2020

(30) Foreign Application Priority Data

Mar. 18, 2019 (TW) ................................. 108109145

(51) Int. Cl.
| | |
|---|---|
| *H01R 13/447* | (2006.01) |
| *H01R 27/02* | (2006.01) |
| *H01R 24/62* | (2011.01) |
| *H05K 5/02* | (2006.01) |
| *H01R 13/46* | (2006.01) |
| *H01R 31/06* | (2006.01) |
| *H01R 27/00* | (2006.01) |
| *H01R 13/44* | (2006.01) |
| *H01R 13/60* | (2006.01) |
| *H01R 13/62* | (2006.01) |
| *H01R 13/453* | (2006.01) |

(52) U.S. Cl.
CPC ........... *H01R 27/02* (2013.01); *H01R 13/447* (2013.01); *H01R 13/46* (2013.01); *H01R 24/62* (2013.01); *H01R 31/065* (2013.01); *H05K 5/0278* (2013.01); *H01R 13/44* (2013.01); *H01R 13/4538* (2013.01); *H01R 13/60* (2013.01); *H01R 13/62* (2013.01); *H01R 27/00* (2013.01); *H01R 31/06* (2013.01)

(58) Field of Classification Search
CPC ...... H05K 5/0278; H01R 27/00; H01R 27/02; H01R 13/60; H01R 13/62; H01R 13/4538; H01R 13/44; H01R 13/447; H01R 31/06; H01R 13/46; H01R 24/62; H01R 31/065
See application file for complete search history.

(56) References Cited

U.S. PATENT DOCUMENTS

| | | | | |
|---|---|---|---|---|
| D470,499 S | * | 2/2003 | Salazar ................ | A01K 11/004 D14/433 |
| 6,908,038 B1 | * | 6/2005 | Le ........................ | G06K 19/077 235/492 |
| 7,092,256 B1 | * | 8/2006 | Salazar ................ | G06F 13/378 361/679.32 |
| 7,679,008 B2 | * | 3/2010 | Lee ..................... | H01R 31/065 174/560 |

(Continued)

*Primary Examiner* — Tho D Ta
(74) *Attorney, Agent, or Firm* — Li & Cai Intellectual Property Office

(57) ABSTRACT

A multiplex connecting device capable of switching to a single connector includes a first connector, a second connector, and an outer housing assembly. The outer housing assembly includes a first shell and a second shell. The first shell and the second shell respectively cover the outside of the first connector and the second connector. The outer housing assembly can move on the first connector and the second connector, and switch to use a single connector (one of the first connector and the second connector). Accordingly, multiple connectors are integrated into one component.

12 Claims, 25 Drawing Sheets

(56) References Cited

U.S. PATENT DOCUMENTS

| | | | |
|---|---|---|---|
| 7,787,243 B2* | 8/2010 | Salazar | H05K 5/0278 |
| | | | 361/679.31 |
| 8,684,753 B2* | 4/2014 | Zhang | H01R 13/6658 |
| | | | 439/131 |
| 9,215,820 B2* | 12/2015 | Villa-Real | H05K 5/0278 |
| D759,661 S * | 6/2016 | Liao | D14/480.7 |
| 2013/0201622 A1* | 8/2013 | Liu | H05K 5/0278 |
| | | | 361/679.32 |
| 2018/0067884 A1* | 3/2018 | Loza | H04R 1/105 |

\* cited by examiner

MULTIPLEX CONNECTING DEVICE CAPABLE OF SWITCHING AN OPERABILITY OF A SINGLE CONNECTOR THEREOF

CROSS-REFERENCE TO RELATED PATENT APPLICATION

This application claims the benefit of priority to Taiwan Patent Application No. 108109145, filed on Mar. 18, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a connecting device, and more particularly to a multiplex connecting device capable of switching to a single connector.

BACKGROUND OF THE DISCLOSURE

In the related art, there are connecting devices with multiplex connectors for users to choose from, and the multiplex connectors are integrated into one component so that the layout of the connecting devices with multiplex connectors would seem less disorganized.

However, if a conventional connecting device with multiplex connectors is plugged with multiple electronic devices at the same time for power or signal transmission, it may result in adverse effects. For example, when a conventional connecting device with multiplex connectors is plugged with multiple electronic devices (such as mobile phones) for charging at the same time, it may result in overload. In another example, when the conventional connecting device with multiplex connectors is plugged with multiple electronic devices (such as mobile phones) for signal transmission at the same time, it may result in interference with each other.

SUMMARY OF THE DISCLOSURE

In response to the above-referenced technical inadequacies, the present disclosure provides a multiplex connecting device capable of switching to a single connector.

In one aspect, the present disclosure provides a multiplex connecting device capable of switching to a single connector. The multiplex connecting device includes a first connector, a second connector, and an outer housing assembly. The first connector includes a first plugging terminal and a first connecting terminal. The second connector includes a second plugging terminal and a second connecting terminal, in which the first connecting terminal of the first connector and the second connecting terminal of the second connector are connected to each other. The outer housing assembly includes a first shell and a second shell, in which the first shell and the second shell are in contact with each other or integrated into one component. The first shell and the second shell are respectively disposed outside of the first connector and the second connector, and the outer housing assembly is capable of moving on the first connector and the second connector. When the outer housing assembly moves toward the second connector, the second shell of the outer housing assembly covers the outside of the second plugging terminal of the second connector so that the second plugging terminal of the second connector is inoperable, and the first plugging terminal of the first connector extends out of the first shell of the outer housing assembly so that the first plugging terminal of the first connector is operable. When the outer housing assembly moves toward the first connector, the first shell of the outer housing assembly covers the outside of the first plugging terminal of the first connector so that the first plugging terminal of the first connector is inoperable, and the second plugging terminal of the second connector extends out of the second shell of the outer housing assembly so that the second plugging terminal of the second connector is operable.

Therefore, the connecting device of the present disclosure integrates multiple connectors into one component so that a user can choose between the connectors by moving the outer housing assembly, and negative effects are therefore effectively prevented from occurring.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
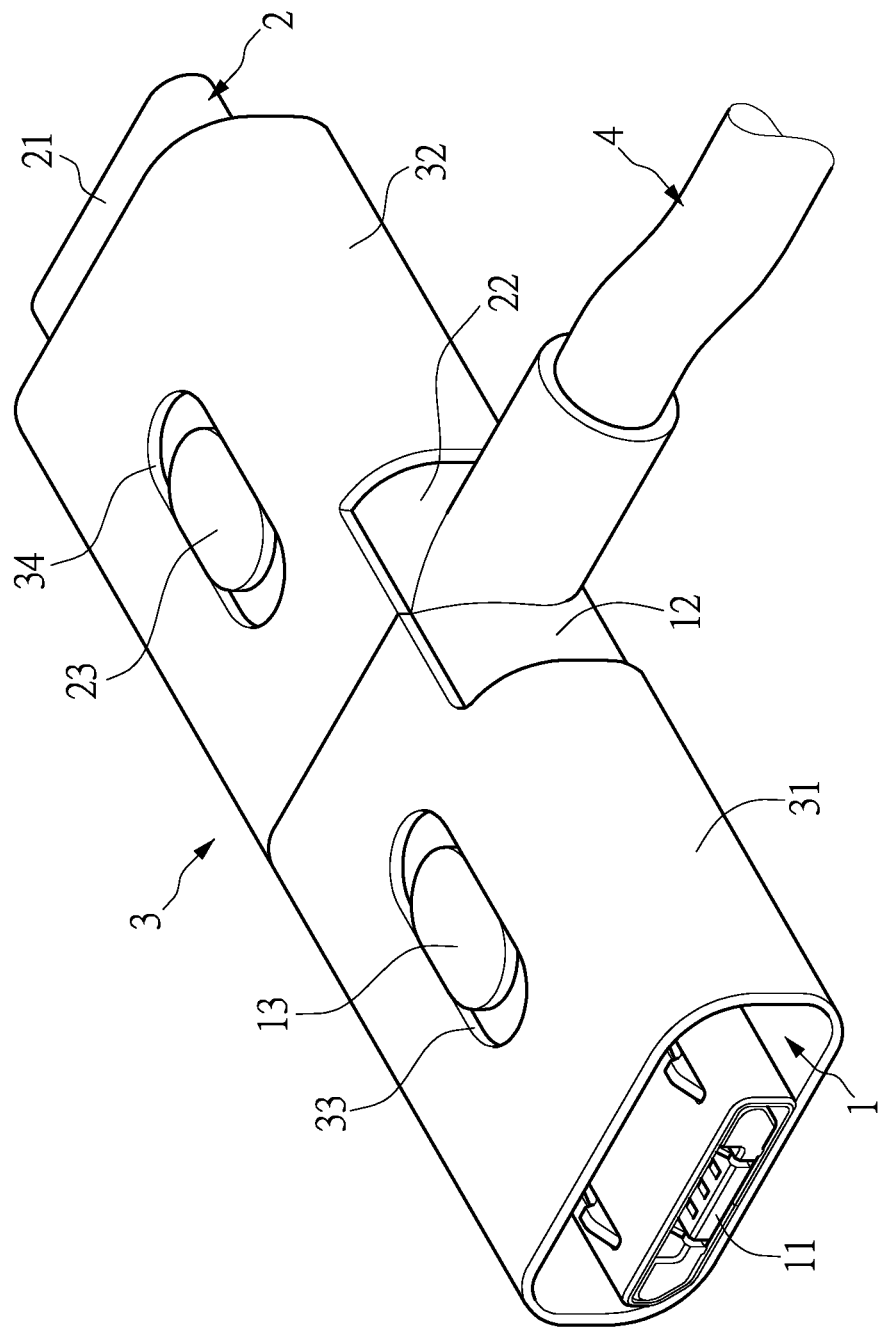
FIG. 1 is a perspective view of a connecting device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, the present disclosure provides a multiplex connecting device capable of switching to a single connector. The multiplex connecting device includes a first connector 1, a second connector 2, and an outer housing assembly 3. The first connector 1 and the second connector 2 can be various types of connectors, and the present disclosure is not limited thereto. For example, the connectors may be USB connectors, IEEE1394 connectors, HDMI connectors, AV terminals, DC terminals, or other electrical connectors. The first connector 1 and the second connector 2 each include members such as an insulator, a terminal disposed on the insulator, and a metal shell covering the outside of the insulator. The terminals can be used to transmit electrical power and signals, etc. The structure of the first connector 1 and the second connector 2 are well known in the art, and will not be reiterated herein.

The first connector 1 includes a first plugging terminal 11 and a first connecting terminal 12. The first plugging terminal 11 and the first connecting terminal 12 are respectively located at two opposite ends of the first connector 1. The first plugging terminal 11 is located at a front end of the first connector 1, that is, the first plugging terminal 11 is located at the end of the first connector 1 close to a mating connector. In other words, the first plugging terminal 11 is located at the end of the first connector 1 facing a plugging direction of the first connector 1. The first connecting terminal 12 is located at a rear end of the first connector 1, that is, the first connecting terminal 12 is located at the end of the first connector 1 away from the mating connector. In other words, the first connecting terminal 12 is located at the end of the first connector 1 facing away from the plugging direction of the first connector 1.

The second connector 2 includes a second plugging terminal 21 and a second connecting terminal 22. The second plugging terminal 21 and the second connecting terminal 22 are respectively located at two opposite ends of the second connector 2. The second plugging terminal 21 is located at a front end of the second connector 2, that is, the second plugging terminal 21 is located at the end of the second connector 2 close to a mating connector. In other words, the second plugging terminal 21 is located at the end of the second connector 2 facing a plugging direction of the second connector 2. The second connecting terminal 22 is located at a rear end of the second connector 2, that is, the second connecting terminal 22 is located at the end of the second connector 2 away from the mating connector. In other words, the second connecting terminal 22 is located at the end of the second connector 2 away from the plugging direction of the second connector 2.

The first connecting terminal 12 of the first connector 1 and the second connecting terminal 22 of the second connector 2 are connected to each other so that the first connector 1 and the second connector 2 are integrated into one component. The plugging direction of the first connector 1 and the plugging direction of the second connector 2 can be located along the same straight line. The first connector 1 and the second connector 2 can be electrically connected to a cable 4. The cable 4 can be electrically connected to the terminals of the first connector 1 and the second connector 2 to facilitate the transmission of electricity and signals.

The outer housing assembly 3 is a hollow body, and the outer housing assembly 3 can be an integrally formed shell or a separate shell. In the present embodiment, the outer housing assembly 3 is a separate shell. The outer housing assembly 3 includes a first shell 31 and a second shell 32, and the first shell 31 and the second shell 32 are in contact with each other or integrated into one component. In the present embodiment, adjacent ends of the first shell 31 and the second shell 32 are in contact with each other. The first shell 31 and the second shell 32 are respectively sleeved outside of the first connector 1 and the second connector 2 so that the outer housing assembly 3 is sleeved outside of the first connector 1 and the second connector 2. The outer housing assembly 3 can move on the first connector 1 and the second connector 2, so as to switch to a single connector (one of the first connector 1 and the second connector 2).

Figure 2:
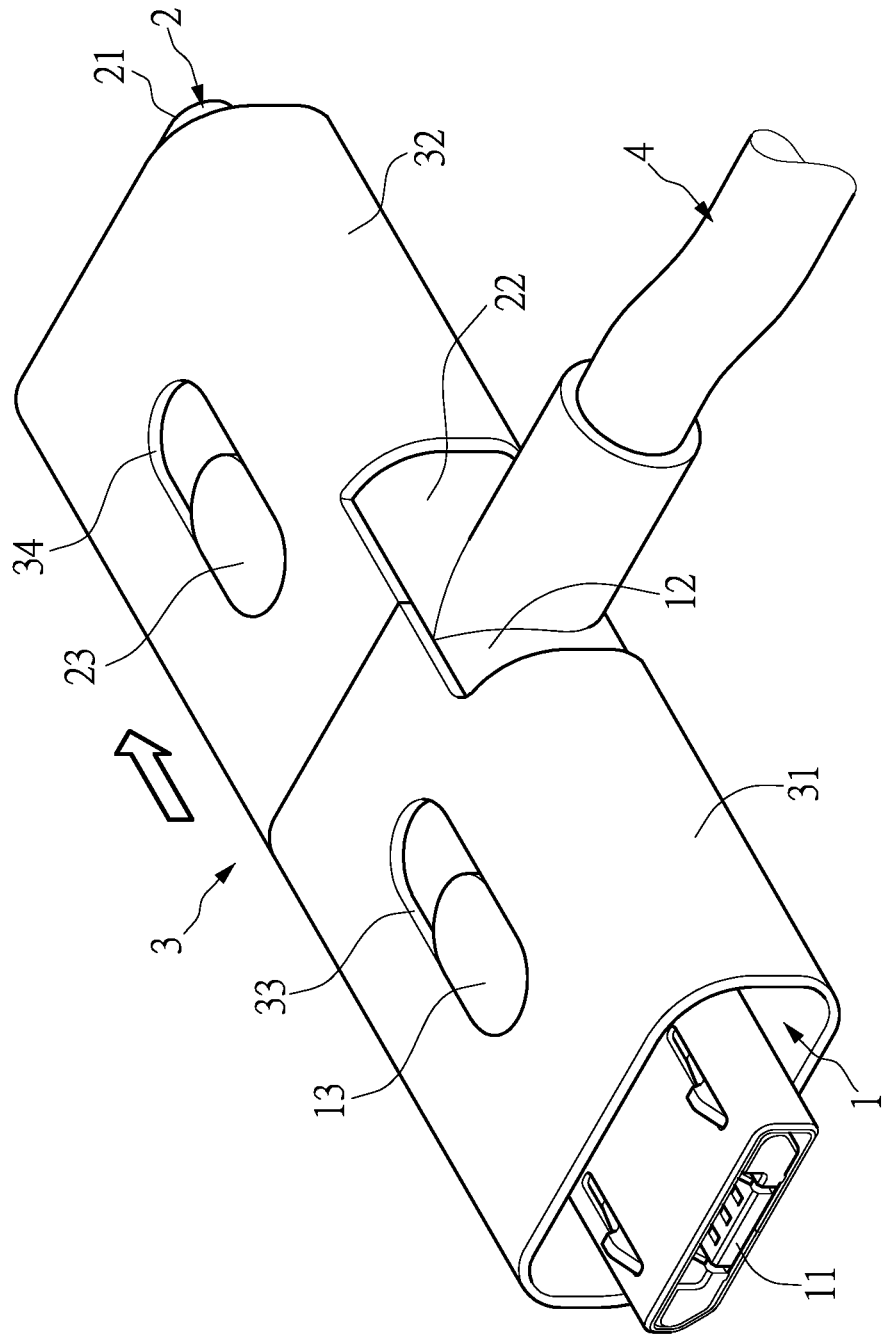
FIG. 2 is a schematic view of a use state (a) of the connecting device according to the first embodiment of the present disclosure.

Referring to FIG. 2, when the outer housing assembly 3 moves toward the second connector 2, the second shell 32 of the outer housing assembly 3 covers the outside of the second plugging terminal 21 of the second connector 2 so that the second plugging terminal 21 of the second connector 2 is inoperable, and the electronic device cannot be smoothly plugged into the second connector 2. At this time, the first plugging terminal 11 of the first connector 1 extends out of the first shell 31 of the outer housing assembly 3 so that the first plugging terminal 11 of the first connector 1 is operable, and the electronic device can be smoothly plugged into the first connector 1.

Figure 3:
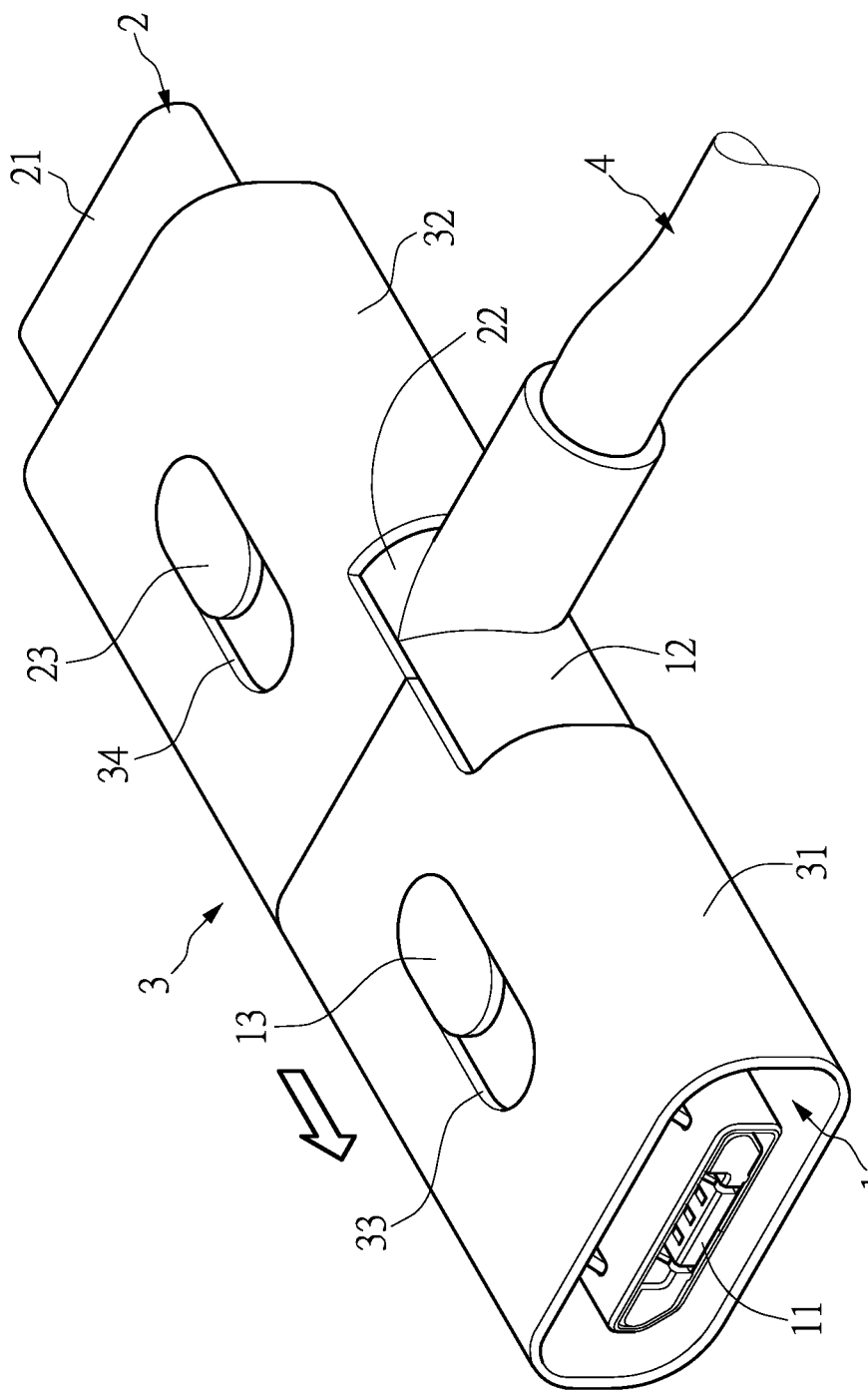
FIG. 3 is a schematic view of a use state (b) of the connecting device according to the first embodiment of the present disclosure.

Referring to FIG. 3, when the outer housing assembly 3 moves toward the first connector 1, the first shell 31 of the outer housing assembly 3 covers the outside of the first plugging terminal 11 of the first connector 1 so that the first plugging terminal 11 of the first connector 1 is inoperable, and the electronic device cannot be smoothly plugged into the first connector 1. At this time, the second plugging terminal 21 of the second connector 2 extends out of the second shell 32 of the outer housing assembly 3 so that the second plugging terminal 21 of the second connector 2 is operable, and the electronic device can be smoothly plugged into the second connector 2. Therefore, a user can choose from one of the first connector 1 and the second connector 2 by moving the outer housing assembly 3. The user can only use one connector at a time.

The multiplex connecting device further includes a guiding mechanism disposed between the first connector 1, the second connector 2, and the outer housing assembly 3. The guiding mechanism can be used to guide and limit the movement of the outer housing assembly 3 on the first connector 1 and the second connector 2. The guiding mechanism provides a first guiding block 13 and a second guiding block 23 that are respectively disposed on the first connector 1 and the second connector 2. The first guiding block 13 and the second guiding blocks 23 can be disposed on both sides of the first connector 1 and the second connector 2, respectively. The guiding mechanism provides a first guiding groove 33 and a second guiding groove 34 disposed on the outer housing assembly 3. The first guiding groove 33 and the second guiding groove 34 respectively extend along the plugging direction of the first connector 1 and the plugging direction of the second connector 2. The length of the first guiding groove 33 and the length of the second guiding groove 34 are respectively longer than the length of the first guiding block 13 and the length of the second guiding block 23. The first guiding block 13 and the second guiding block 23 are slidably fitted into the first guiding groove 33 and the second guiding groove 34, respectively, so as to form the guiding mechanism. The guiding mechanism can guide the outer housing assembly 3 to move on the first connector 1 and the second connector 2. The first guiding block 13 and the second guiding block 23 can be fixed in position and contact the two ends of each the first guiding groove 33 and the second guiding groove 34, respectively. The first guiding groove 33 and the second guiding groove 34 can each be a through hole or a blind hole.

Second Embodiment

Figure 4:
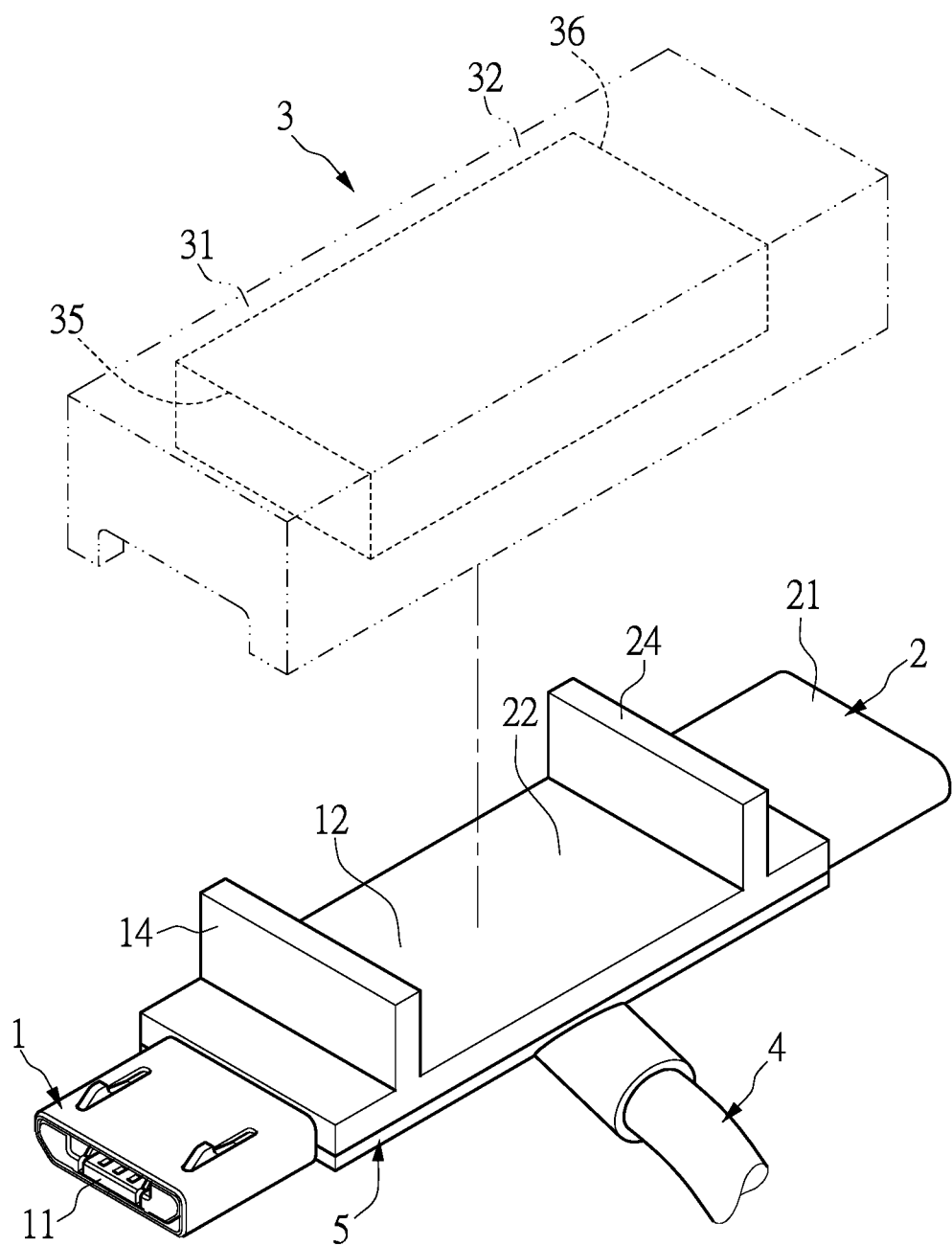
FIG. 4 is an exploded perspective view of the connecting device according to a second embodiment of the present disclosure.
Figure 5:
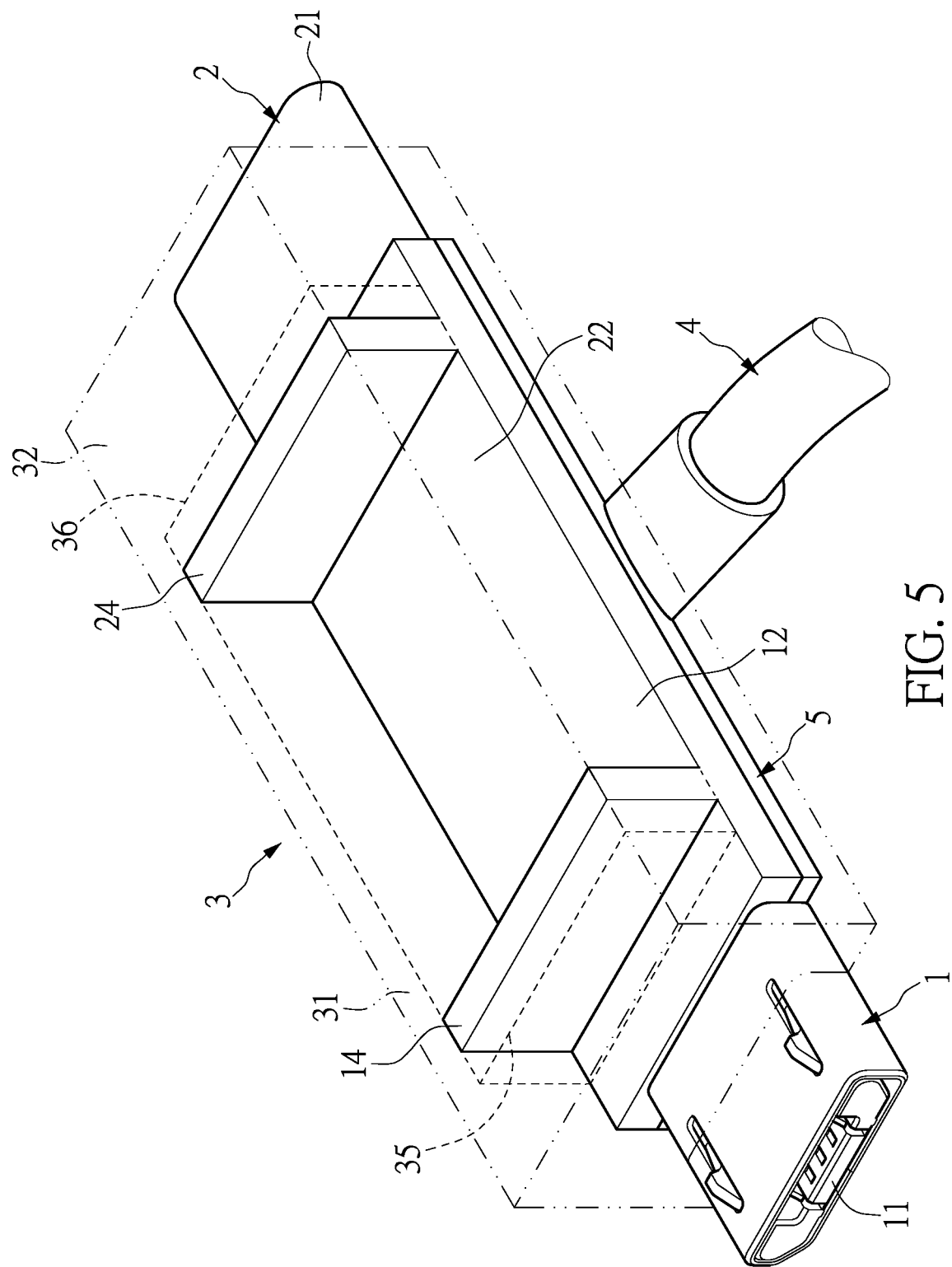
FIG. 5 is a perspective view of the connecting device according to the second embodiment of the present disclosure.

Referring to FIG. 4 and FIG. 5, the first connector 1 and the second connector 2 can electrically connect the cable 4 through a circuit board 5. The outer housing assembly 3 is a hollow body, and the outer housing assembly 3 is an integrally formed shell. The outer housing assembly 3 includes a first shell 31 and a second shell 32, and the first shell 31 and the second shell 32 are integrated into one component. The first shell 31 and the second shell 32 are respectively sleeved outside of the first connector 1 and the second connector 2. The outer housing assembly 3 can move on the first connector 1 and the second connector 2, so as to switch to a single connector. The outer housing assembly 3 further has a first stopping end 35 and a second stopping end 36 formed inside of the outer housing assembly 3, and the first stopping end 35 and the second stopping end 36 are respectively close to the two ends of the outer housing assembly 3. The first connector 1 and the second connector 2 respectively provide a first convex portion 14 and a second convex portion 24 disposed on the first connector 1 and the second connector 2.

Figure 6:
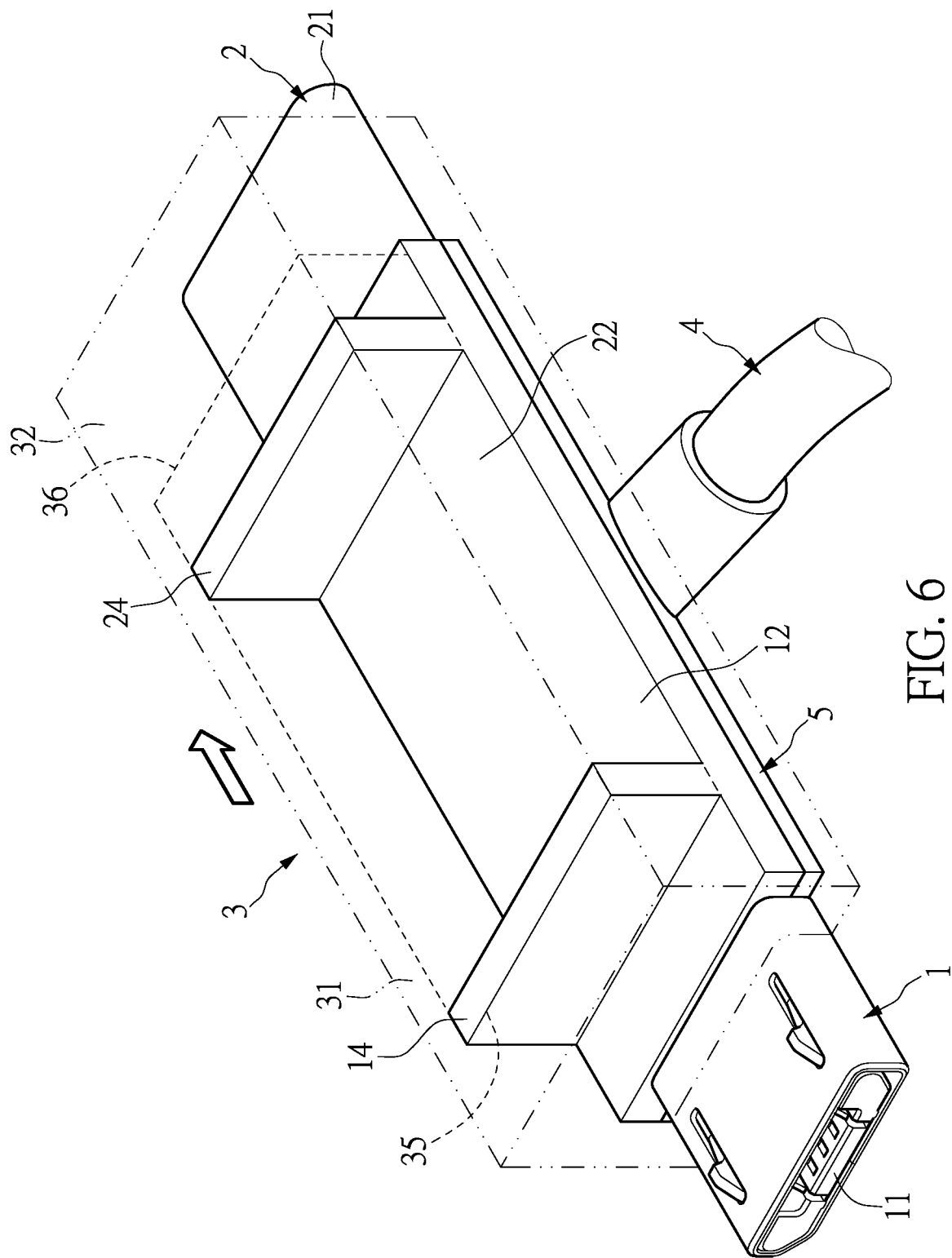
FIG. 6 is a schematic view of a use state (a) of the connecting device according to the second embodiment of the present disclosure.

As shown in FIG. 6, when the outer housing assembly 3 moves toward the second connector 2, the second shell 32 of the outer housing assembly 3 covers the outside of the second plugging terminal 21 of the second connector 2 so that the second plugging terminal 21 of the second connector 2 is inoperable, and the first convex portion 14 and the first stopping end 35 can be in contact with each other to be fixed in position. At this time, the first plugging terminal 11 of the first connector 1 extends out of the first shell 31 of the outer housing assembly 3, so that the first plugging terminal 11 of the first connector 1 is operable.

Figure 7:
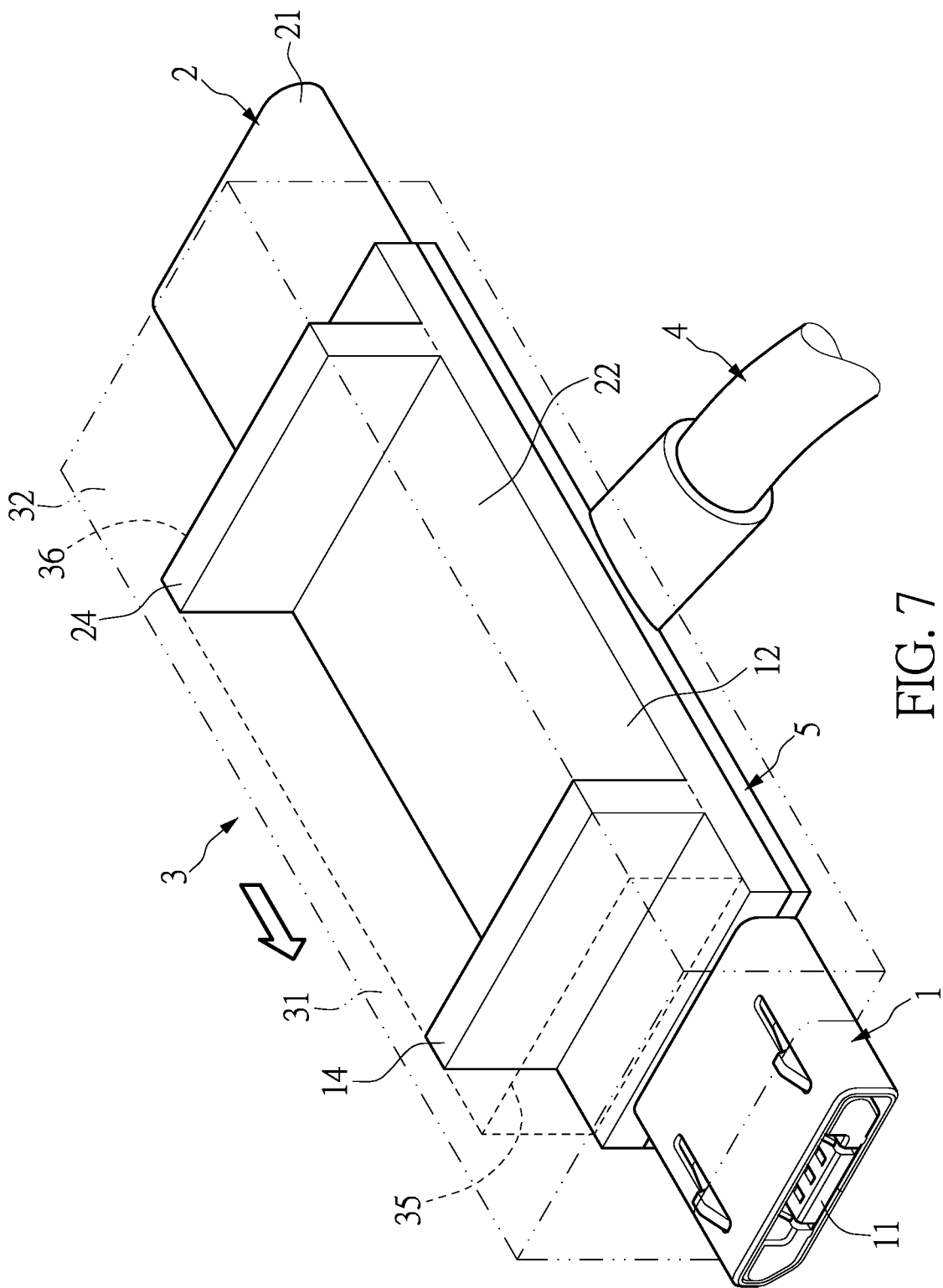
FIG. 7 is a schematic view of a use state (b) of the connecting device according to the second embodiment of the present disclosure.

As shown in FIG. 7, when the outer housing assembly 3 moves toward the first connector 1, the first shell 31 of the outer housing assembly 3 covers the outside of the first plugging terminal 11 of the first connector 1 so that the first plugging terminal 11 of the first connector 1 is inoperable, and the second convex portion 24 and the second stopping end 36 can be in contact with each other to be fixed in position. At this time, the second plugging terminal 21 of the second connector 2 extends out of the second shell 32 of the outer housing assembly 3 so that the second plugging terminal 21 of the second connector 2 is operable. Therefore, a user can choose from one of the first connector 1 and the second connector 2 by moving the outer housing assembly 3. The user can only use one connector at a time.

Third Embodiment

Figure 8:
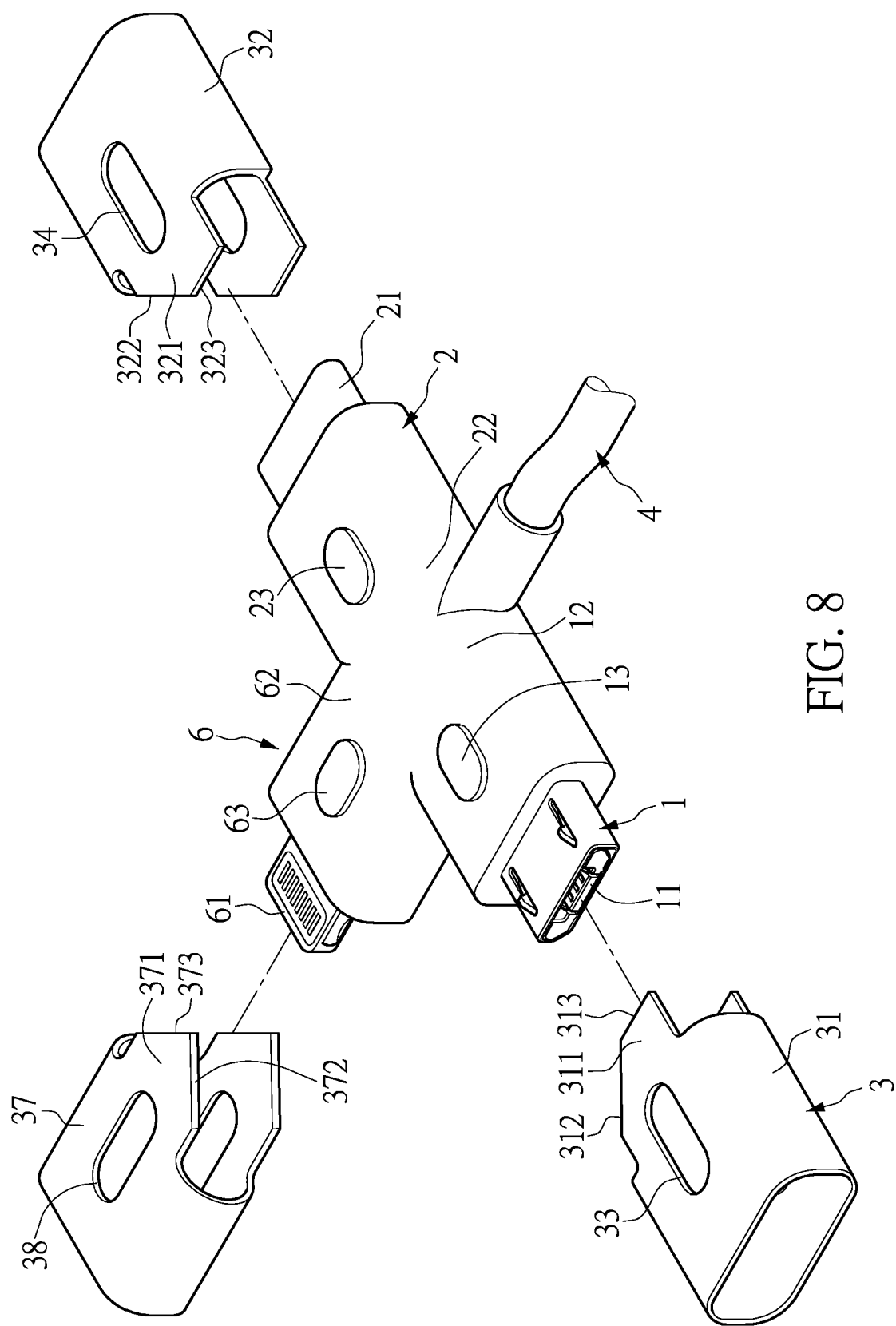
FIG. 8 is an exploded perspective view of the connecting device according to a third embodiment of the present disclosure.
Figure 9:
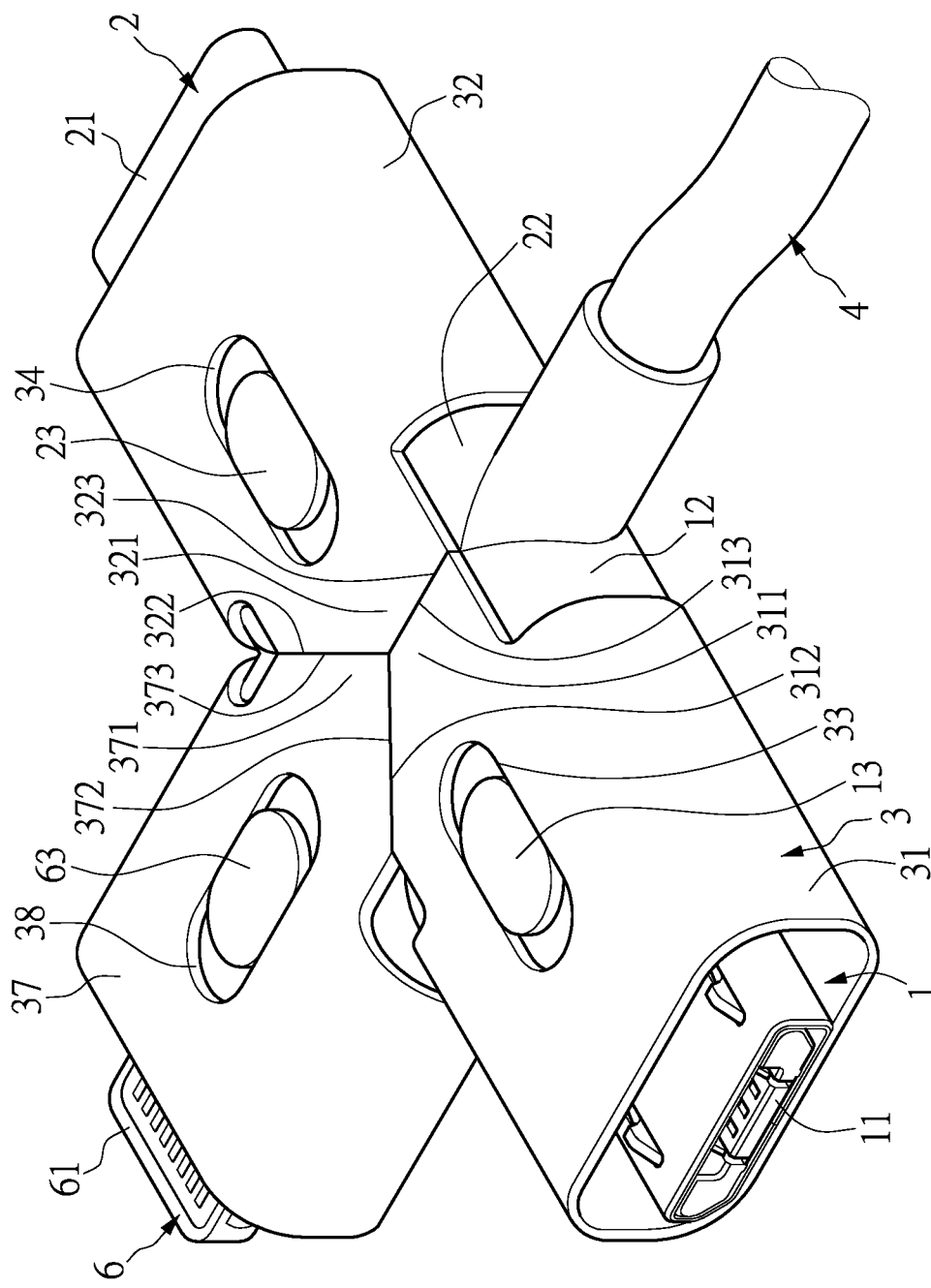
FIG. 9 is a perspective view of the connecting device according to the third embodiment of the present disclosure.

Referring to FIG. 8 and FIG. 9, the connecting device includes a first connector 1, a second connector 2, an outer housing assembly 3, and a third connector 6. The structure of the first connector 1 and the second connector 2 are the same as those in the above embodiment, and will not be reiterated herein. The third connector 6 can be various types of connectors, and the present disclosure is not limited thereto. The third connector 6 includes a third plugging terminal 61 and a third connecting terminal 62. The third plugging terminal 61 and the third connecting terminal 62 are respectively located at two opposite ends of the third connector 6. The third plugging terminal 61 is located at a front end of the third connector 6, that is, the third plugging terminal 61 is located at the end of the third connector 6 close to a mating connector. In other words, the third plugging terminal 61 is located at the end of the third connector 6 facing the plugging direction of the third connector 6. The third connecting terminal 62 is located at a rear end of the third connector 6, that is, the third connecting terminal 62 is located at the end of the third connector 6 away from the mating connector. In other words, the third connecting terminal 62 is located at the end of the third connector 6 facing away from the plugging direction of the first connector 1.

The third connecting terminal 62 of the third connector 6 correspondingly connects to the first connecting terminal 12 of the first connector 1 and the second connecting terminal 22 of the second connector 2 so that the first connector 1, the second connector 2, and the third connector 6 are integrated into one component. The plugging direction of the third connector 6 is perpendicular to the plugging direction of the first connector 1 and the plugging direction of the second connector 2. The third connector 6 can electrically connect to the cable 4.

The outer housing assembly 3 is a separate shell, and the outer housing assembly 3 includes a first shell 31, a second shell 32, and a third shell 37. The first shell 31, the second shell 32, and the third shell 37 are individually formed, and the first shell 31, the second shell 32, and the third shell 37 of the outer housing assembly 3 are hollow bodies, respectively. The first shell 31, the second shell 32, and the third shell 37 are respectively disposed (or sleeved) outside of the first connector 1, the second connector 2, and the third connector 6 so that the outer housing assembly 3 is sleeved outside of the first connector 1, the second connector 2, and the third connector 6. The outer housing assembly 3 can move on the first connector 1, the second connector 2, and the third connector 6, so as to switch to a single connector (one of the first connector 1, the second connector 2, and the third connector 6).

Adjacent ends of the first shell 31, the second shell 32, and the third shell 37 respectively have a first interlocking end 311, a second interlocking end 321, and a third interlocking end 371. The first interlocking end 311, the second interlocking end 321, and the third interlocking end 371 are in contact with each other so that the first shell 31, the second shell 32, and the third shell 37 are linked with each other. The first interlocking end 311 has a first inclined plane 312 and a first plane 313. An included angle between the first inclined plane 312 and the first plane 313 can be 135 degrees. The second interlocking end 321 has a second inclined plane 322 and a second plane 323. An included angle between the second inclined plane 322 and the second plane 323 can be 135 degrees. The third interlocking end 371 has a third inclined plane 372 and a fourth inclined plane 373. An included angle between the third inclined plane 372 and the fourth inclined plane 373 can be 90 degrees. The first plane 313 of the first interlocking end 311 and the second plane 323 of the second interlocking end 321 are in contact with each other. The first inclined plane 312 of the first interlocking end 311 and the second inclined plane 322 of the second interlocking end 321 can be in contact with the third inclined plane 372 and the fourth inclined plane 373 of the third interlocking end 371, respectively.

The third connector 6 has a third guiding block 63 disposed on the third connector 6, and the third guiding blocks 63 can be disposed on both sides of the third connector 6, respectively. The outer housing assembly 3 has a third guiding groove 38 disposed on the outer housing assembly 3, and the third guiding groove 38 extends along the plugging direction of the third connector 6. The length of the third guiding groove 38 is longer than the length of the third guiding block 63. The third guiding block 63 is slidably fitted into the third guiding groove 38, and the third guiding groove 38 can guide the movement of the third shell 37 of the outer housing assembly 3 on the third connector 6. The third guiding block 63 can be fixed in position and contact the two ends of the third guiding groove 38. The third guiding groove 38 can be a through hole or a blind hole.

Figure 10:
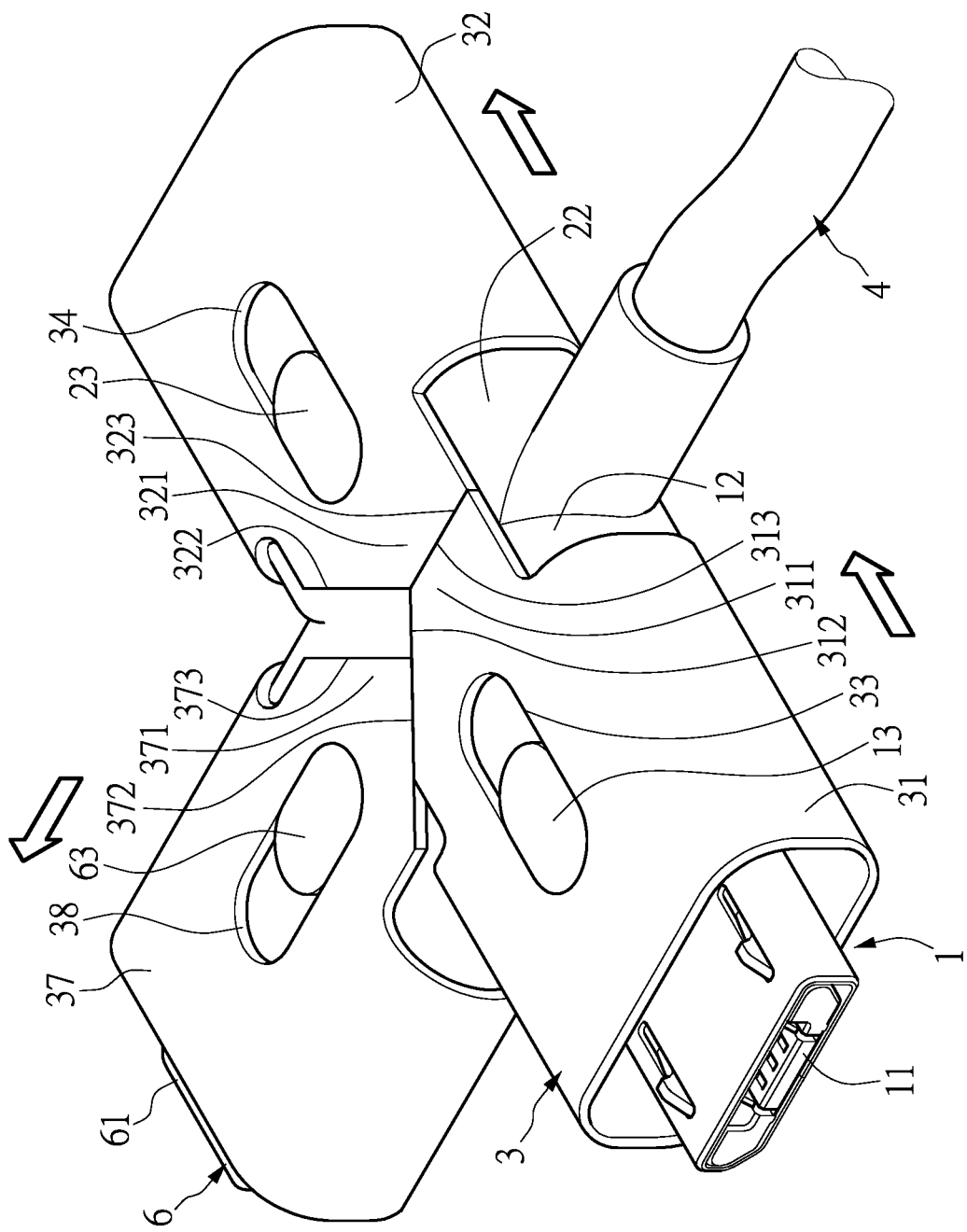
FIG. 10 is a schematic view of a use state (a) of the connecting device according to the third embodiment of the present disclosure.

As shown in FIG. 10, when the first shell 31 of the outer housing assembly 3 moves toward the second connector 2, the first shell 31 can respectively push and contact the third inclined plane 372 of the third shell 37 and the second plane 323 of the second shell 32 by the first inclined plane 312 and the first plane 313 of the first shell 31, so that the third shell 37 and the second shell 32 are pushed to respectively cover the outside of the third plugging terminal 61 of the third connector 6 and the second plugging terminal 21 of the second connector 2. Accordingly, the third plugging terminal 61 of the third connector 6 and the second plugging terminal 21 of the second connector 2 are inoperable. At this time, the first plugging terminal 11 of the first connector 1 extends out of the first shell 31 of the outer housing assembly 3 so that the first plugging terminal 11 of the first connector 1 is operable.

Figure 11:
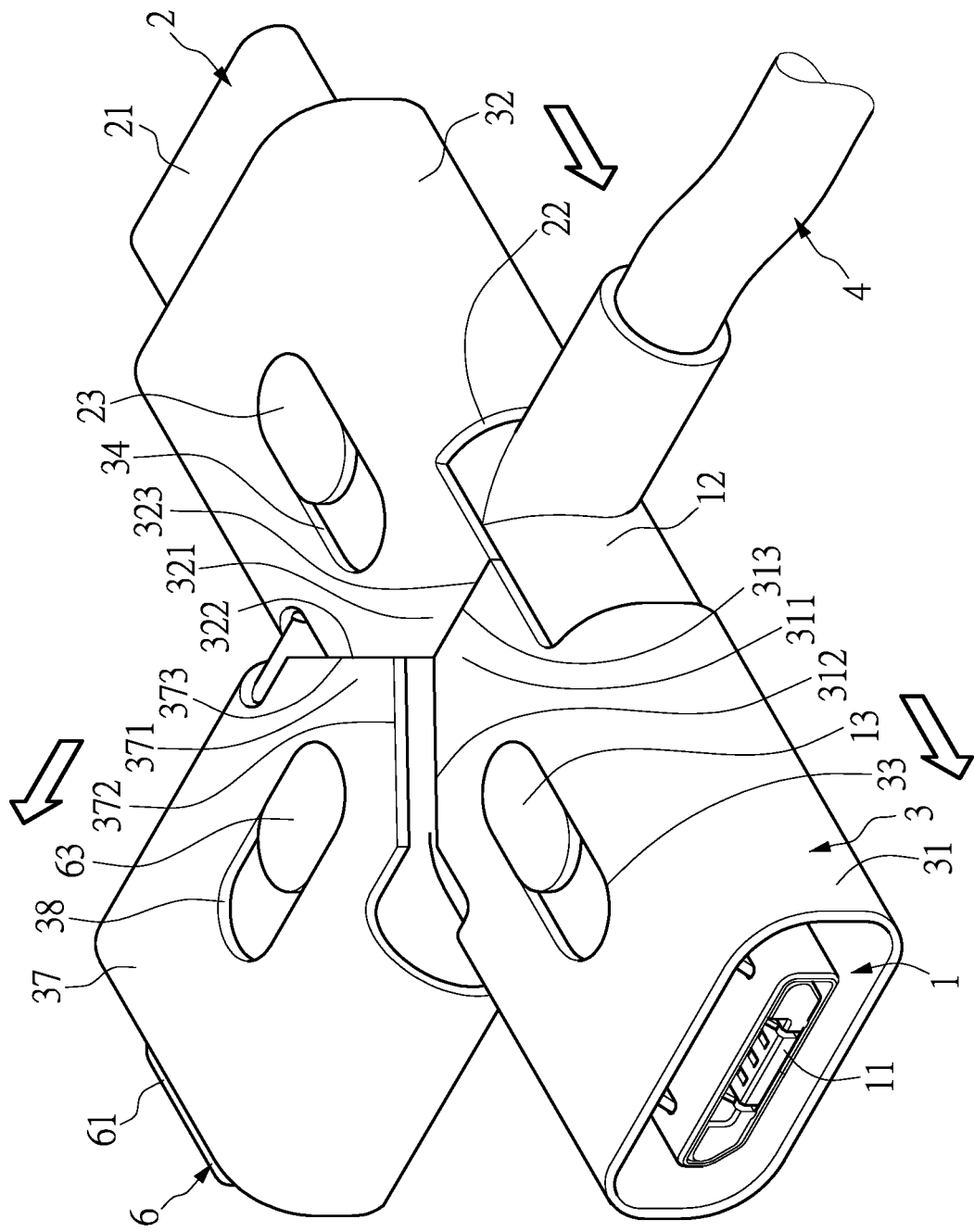
FIG. 11 is a schematic view of a use state (b) of the connecting device according to the third embodiment of the present disclosure.

As shown in FIG. 11, when the second shell 32 of the outer housing assembly 3 moves toward the first connector 1, the second shell 32 respectively pushes and contacts the fourth inclined plane 373 of the third shell 37 and the first plane 313 of the first shell 31 by the second inclined plane 322 and the second plane 323 of the second shell 32, so that the third shell 37 and the first shell 31 are pushed to respectively cover the outside of the third plugging terminal 61 of the third connector 6 and the first plugging terminal 11 of the first connector 1. Accordingly, the third plugging terminal 61 of the third connector 6 and the first plugging terminal 11 of the first connector 1 are inoperable. At this time, the second plugging terminal 21 of the second connector 2 extends out of the second shell 32 of the outer housing assembly 3 so that the second plugging terminal 21 of the second connector 2 is operable.

Figure 12:
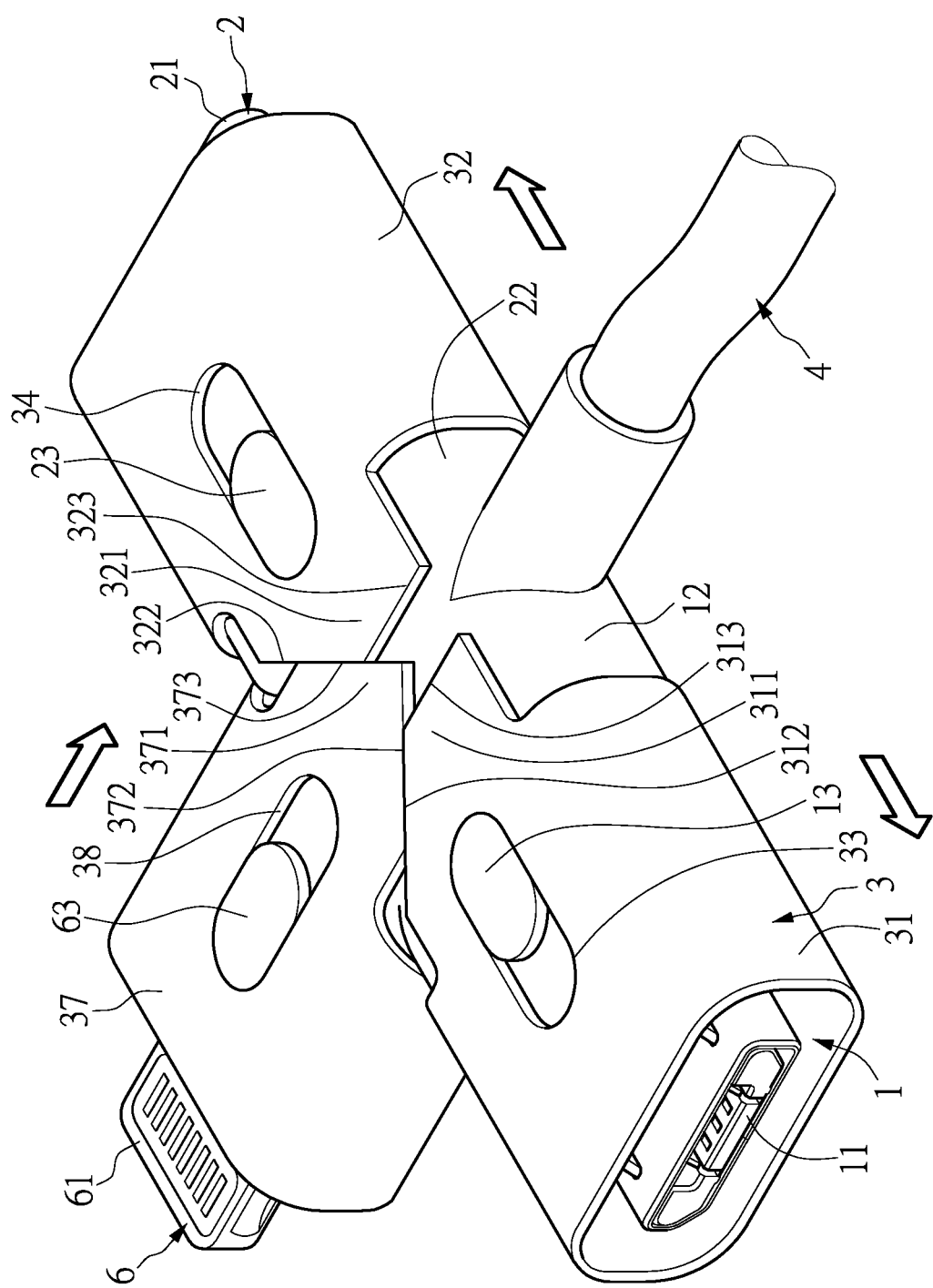
FIG. 12 is a schematic view of a use state (c) of the connecting device according to the third embodiment of the present disclosure.

As shown in FIG. 12, when the third shell 37 of the outer housing assembly 3 moves toward the first connector 1 and the second connector 2, the third shell 37 respectively pushes and contacts the first inclined plane 312 of the first shell 31 and the second inclined plane 322 of the second shell 32 by the third inclined plane 372 and the fourth inclined plane 373 of the third shell 37, so that the first shell 31 and the second shell 32 are pushed to respectively cover the outside of the first plugging terminal 11 of the first connector 1 and the second plugging terminal 21 of the second connector 2. Accordingly, the first plugging terminal 11 of the first connector 1 and the second plugging terminal 21 of the second connector 2 are inoperable. At this time, the third plugging terminal 61 of the third connector 6 extends out of the third shell 37 of the outer housing assembly 3 so that the third plugging terminal 61 of the third connector 6 is operable.

Fourth Embodiment

Figure 13:
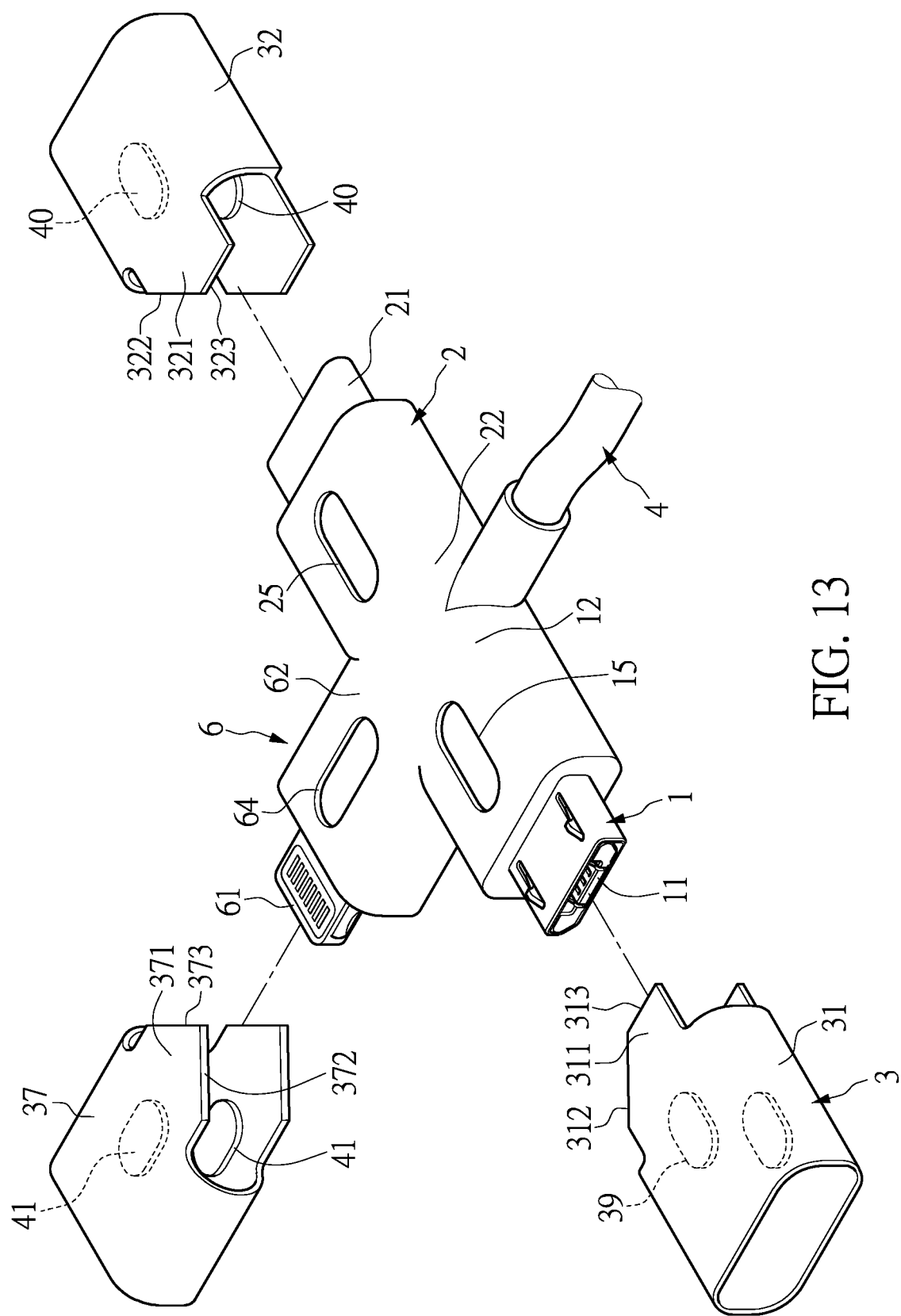
FIG. 13 is an exploded perspective view of the connecting device according to a fourth embodiment of the present disclosure.

Referring to FIG. 13, the first connector 1, the second connector 2, and the third connector 6 have guiding grooves 15, 25, and 64 respectively disposed on the first connector 1, the second connector 2, and the third connector 6. The first shell 31, the second shell 32, and the third shell 37 have guiding blocks 39, 40, and 41 respectively disposed inside of the first shell 31, the second shell 32, and the third shell 37 of the outer housing assembly 3. The guiding blocks 39, 40 and 41 are respectively and slidably fitted into the guiding grooves 15, 25 and 64 to form the guiding mechanism.

Fifth Embodiment

Figure 14:
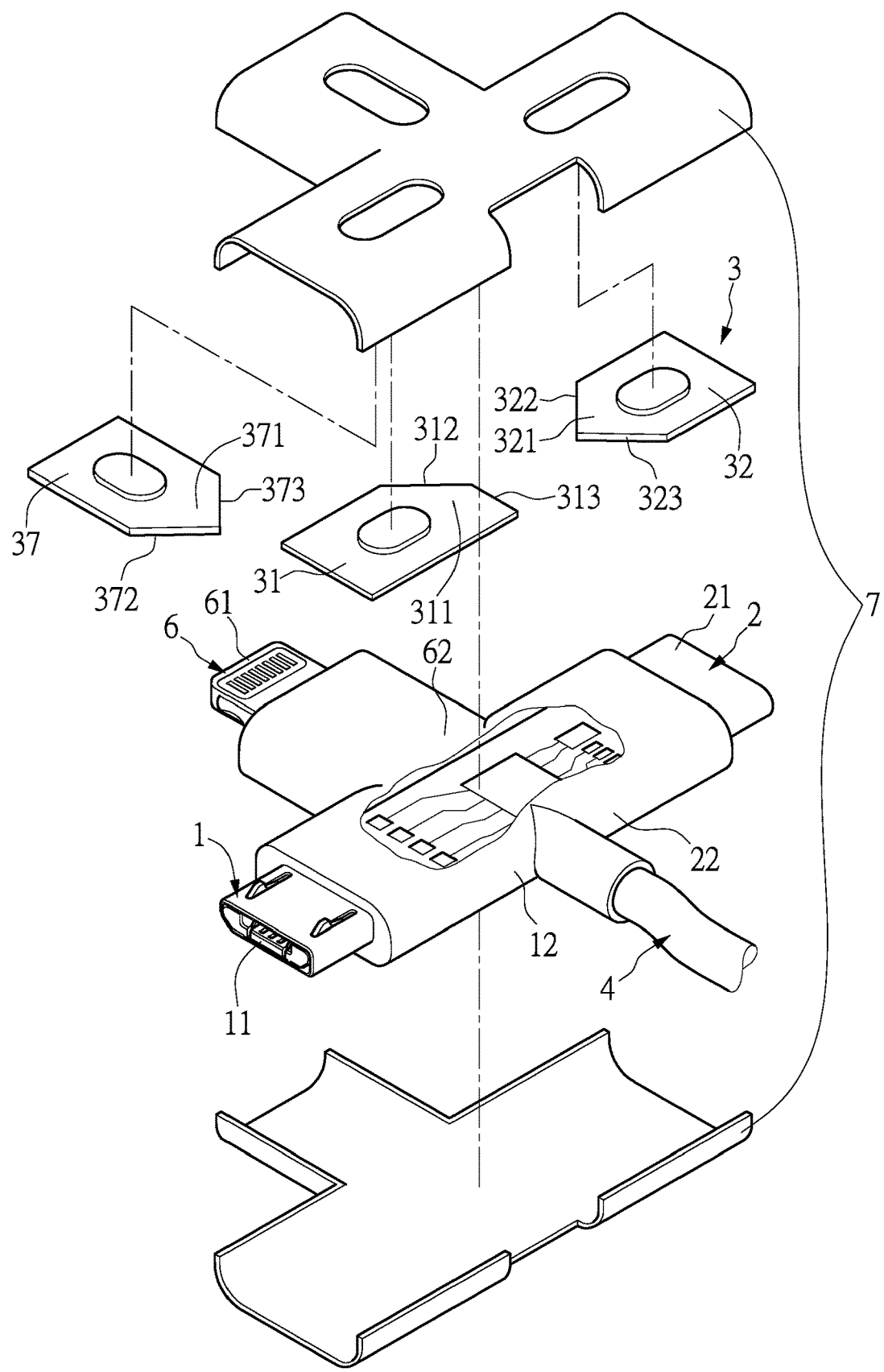
FIG. 14 is an exploded perspective view of the connecting device according to a fifth embodiment of the present disclosure.
Figure 15:
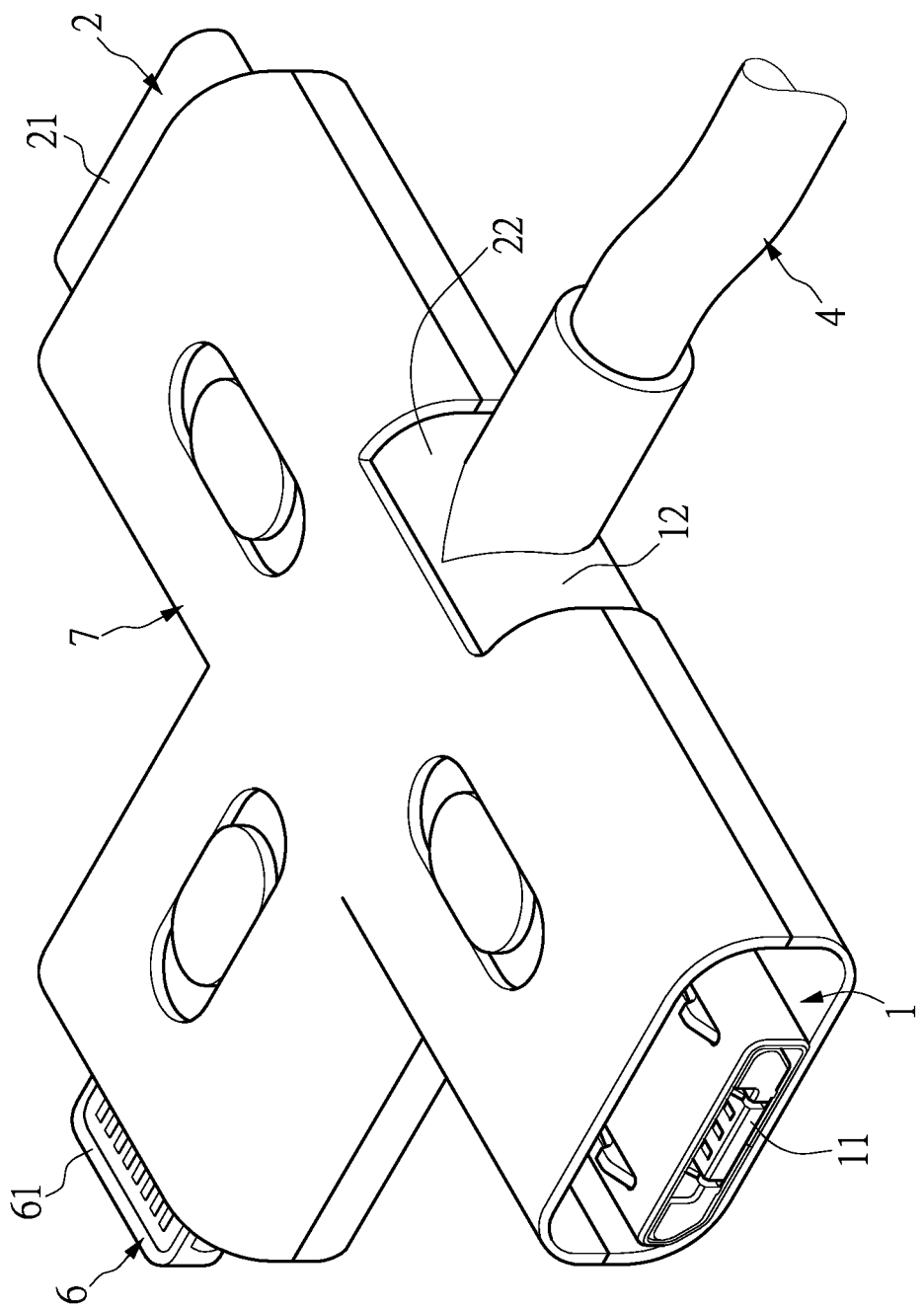
FIG. 15 is a perspective view of the connecting device according to the fifth embodiment of the present disclosure.

Referring to FIG. 14 and FIG. 15, the structure and operation of this embodiment are substantially the same as the third embodiment. The only difference is that the first shell 31, the second shell 32, and the third shell 37 of the outer housing assembly 3 are sheet body, respectively. The first shell 31, the second shell 32, and the third shell 37 are respectively disposed outside of the first connector 1, the second connector 2, and the third connector 6. The outer housing assembly 3 tightly contacts the first connector 1, the second connector 2, and the third connector 6, and the outer housing assembly 3 can move on the first connector 1, the second connector 2, and the third connector 6 to switch to a single connector (one of the first connector 1, the second connector 2, and the third connector 6). The multiplex connecting device further includes an outer covering shell 7 sleeved outside of the outer housing assembly 3 to position the outer housing assembly 3. The multiplex connecting device further includes a guiding mechanism disposed between the outer housing assembly 3 and the outer covering shell 7 to guide and restrict the movement of the outer housing assembly 3 on the first connector 1, the second connector 2, and the third connector 6.

Sixth Embodiment

Figure 16:
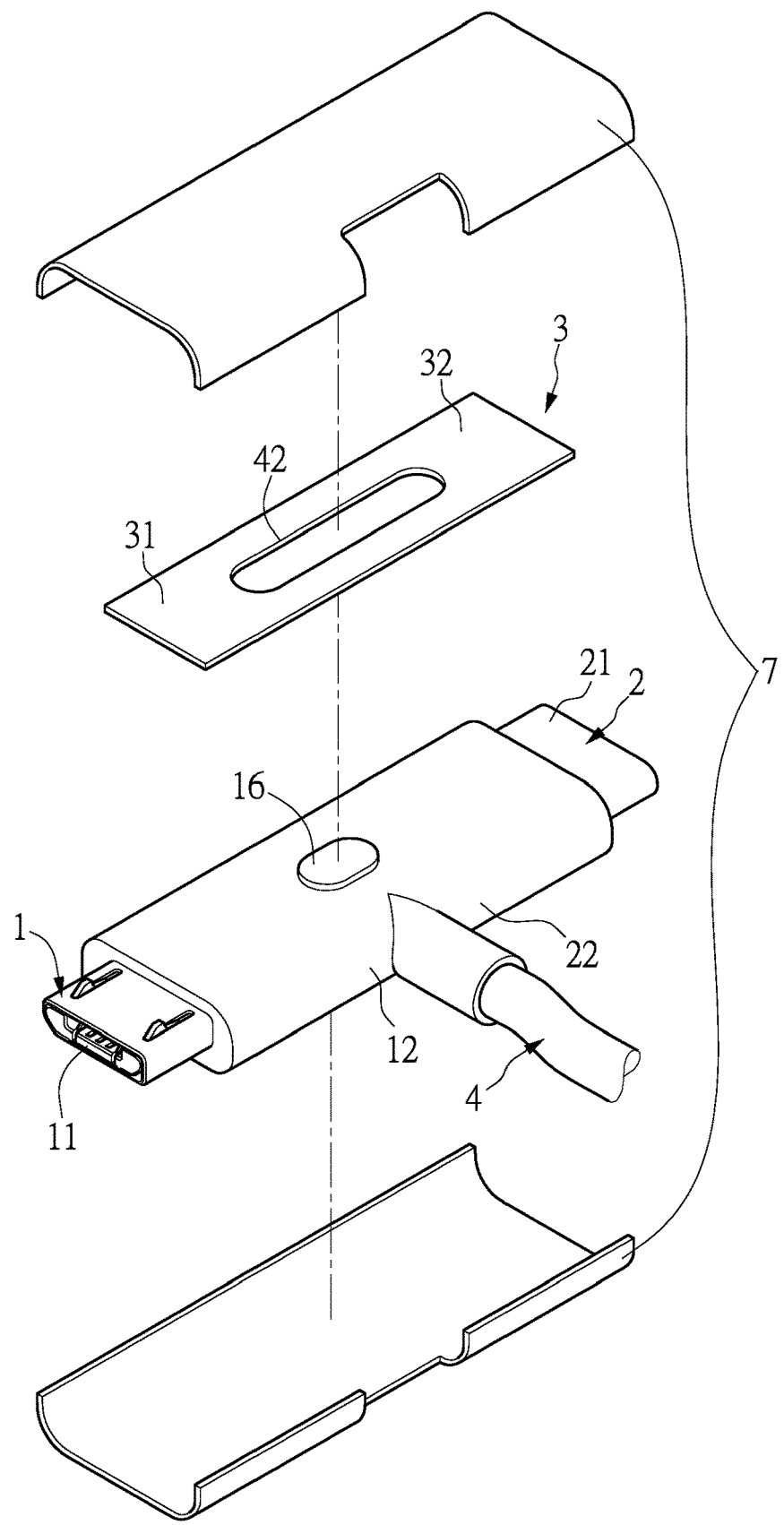
FIG. 16 is an exploded perspective view of the connecting device according to a sixth embodiment of the present disclosure.

Referring to FIG. 16, the structure and the operation of this embodiment are substantially the same as those of the second embodiment. The only difference is that the first shell 31 and the second shell 32 of the outer housing assembly 3 are sheet bodies, and the first shell 31 and the second shell 32 are respectively disposed outside of the first connector 1 and the second connector 2. The outer housing assembly 3 tightly contacts the first connector 1 and the second connector 2. Accordingly, the outer housing assembly 3 can move on the first connector 1 and the second connector 2 to switch to a single connector (one of the first connector 1 and the second connector 2). The multiplex connecting device further includes an outer covering shell 7 sleeved outside of the outer housing assembly 3 to position the outer housing assembly 3. The multiplex connecting device further includes a guiding mechanism disposed between the outer housing assembly 3 and the outer covering shell 7 to guide and restrict the movement of the outer housing assembly 3 on the first connector 1 and the second connector 2. The guiding mechanism includes a fourth guiding block 16 disposed between the first connector 1 and the second connector 2, and a fourth guiding groove 42 disposed on the outer housing assembly 3. The fourth guiding groove 42 extends along the plugging direction of the first connector 1 and the second connector 2. The length of the fourth guiding groove 42 is greater than the length of the fourth guiding block 16. The fourth guiding block 16 is slidably fitted into the fourth guiding groove 42 to form the guiding mechanism, and the fourth guiding block 16 can guide the movement of the outer housing assembly 3 on the first connector 1 and the second connector 2.

Seventh Embodiment

Figure 17:
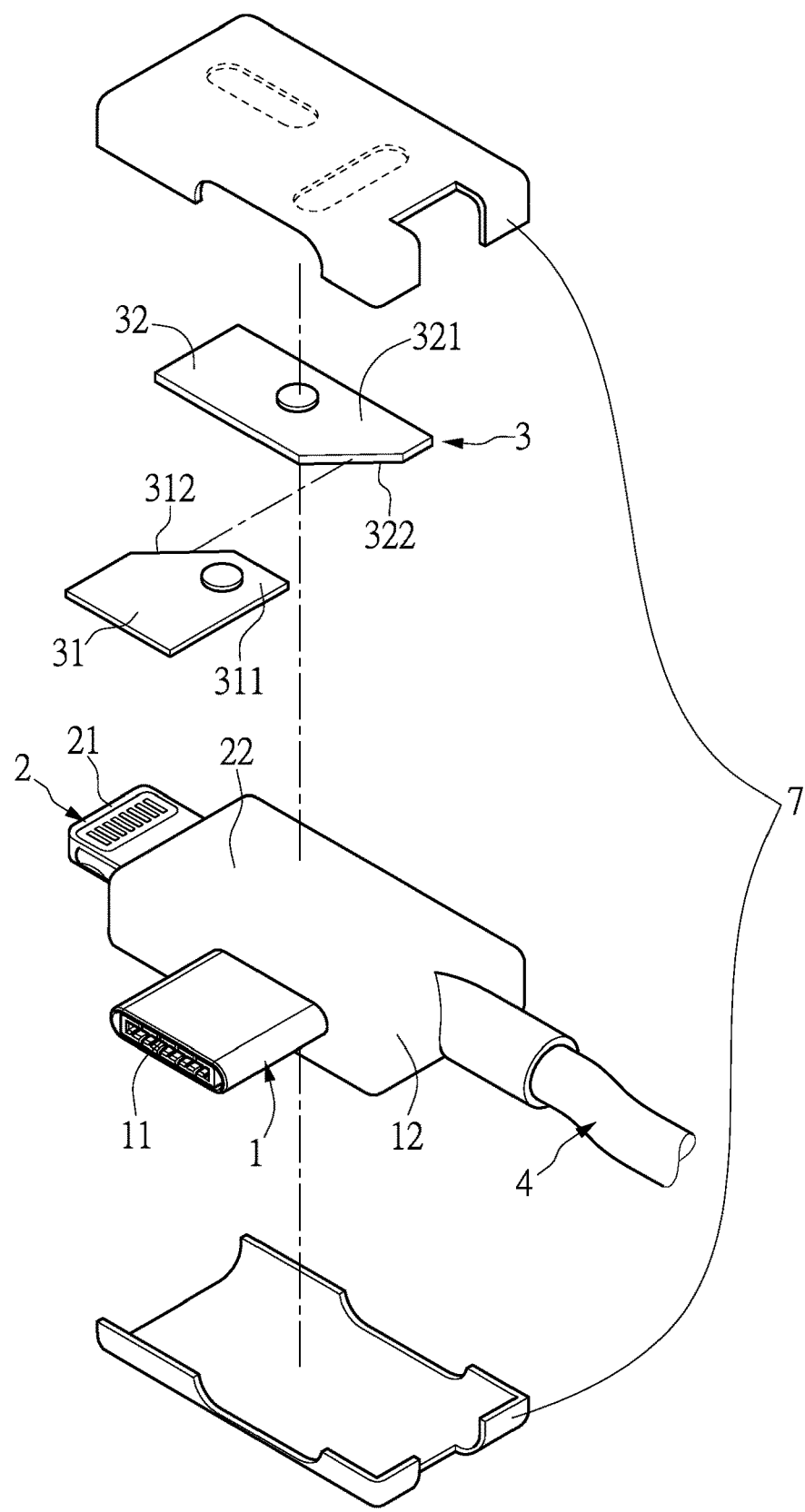
FIG. 17 is an exploded perspective view of the connecting device according to a seventh embodiment of the present disclosure.
Figure 18:
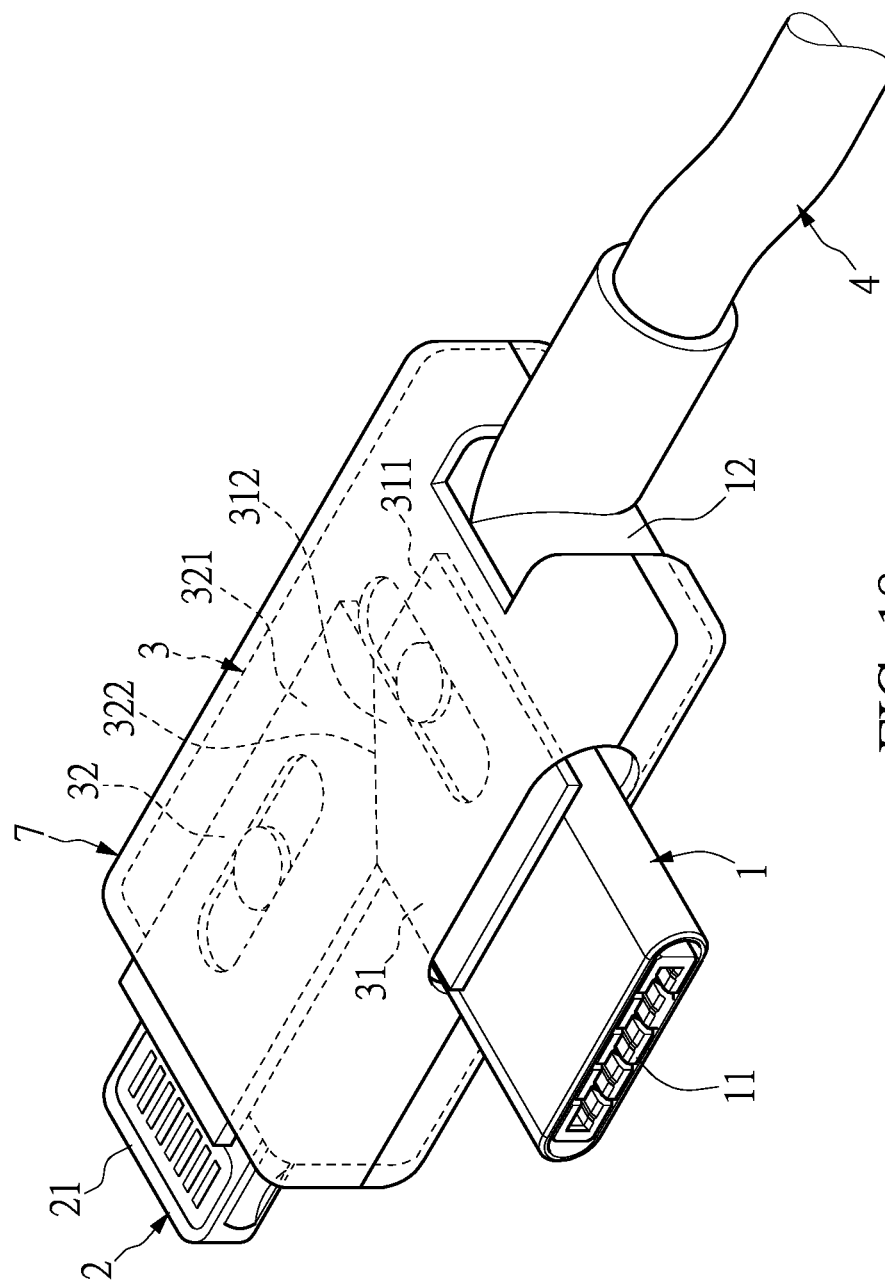
FIG. 18 is a perspective view of the connecting device according to the seventh embodiment of the present disclosure.

Referring to FIG. 17 and FIG. 18, the connecting device includes a first connector 1, a second connector 2, and an outer housing assembly 3. The first connector 1 includes a first plugging terminal 11 and a first connecting terminal 12. The second connector 2 includes a second plugging terminal 21 and a second connecting terminal 22. The first connecting terminal 12 and the second connecting terminal 22 are connected to each other so that the first connector 1 and the second connector 2 are integrated into one component. The plugging direction of the first connector 1 and the plugging direction of the second connector 2 are perpendicular to each other.

The outer housing assembly 3 can be a separate shell, and the outer housing assembly 3 includes a first shell 31 and a second shell 32. The first shell 31 and the second shell 32 are individually formed, and the first shell 31 and the second shell 32 are sheet bodies. The first shell 31 and the second shell 32 are respectively disposed on the first connector 1 and the second connector 2 so that the outer housing assembly 3 tightly contacts the first connector 1 and the second connector 2. The outer housing assembly 3 can move on the first connector 1 and the second connector 2, so as to switch to a single connector (one of the first connector 1 and the second connector 2). In the present embodiment, the multiplex connecting device further includes an outer covering shell 7 sleeved outside of the outer housing assembly 3, so as to position the outer housing assembly 3. In addition, the multiplex connecting device further includes a guiding mechanism disposed between the outer housing assembly 3 and the outer covering shell 7, so as to guide and restrict the movement of the outer housing assembly 3 on the first connector 1 and the second connector 2.

Adjacent ends of the first shell 31 and the second shell 32 respectively have a first interlocking end 311 and a second interlocking end 321. The first interlocking end 311 and the second interlocking end 321 contact each other so that the first shell 31 and the second shell 32 can be linked with each other. The first interlocking end 311 can include a first inclined plane 312, and the second interlocking end 321 can have a second inclined plane 322. The first inclined plane 312 of the first interlocking end 311 and the second inclined plane 322 of the second interlocking end 321 are in contact with each other.

Figure 19:
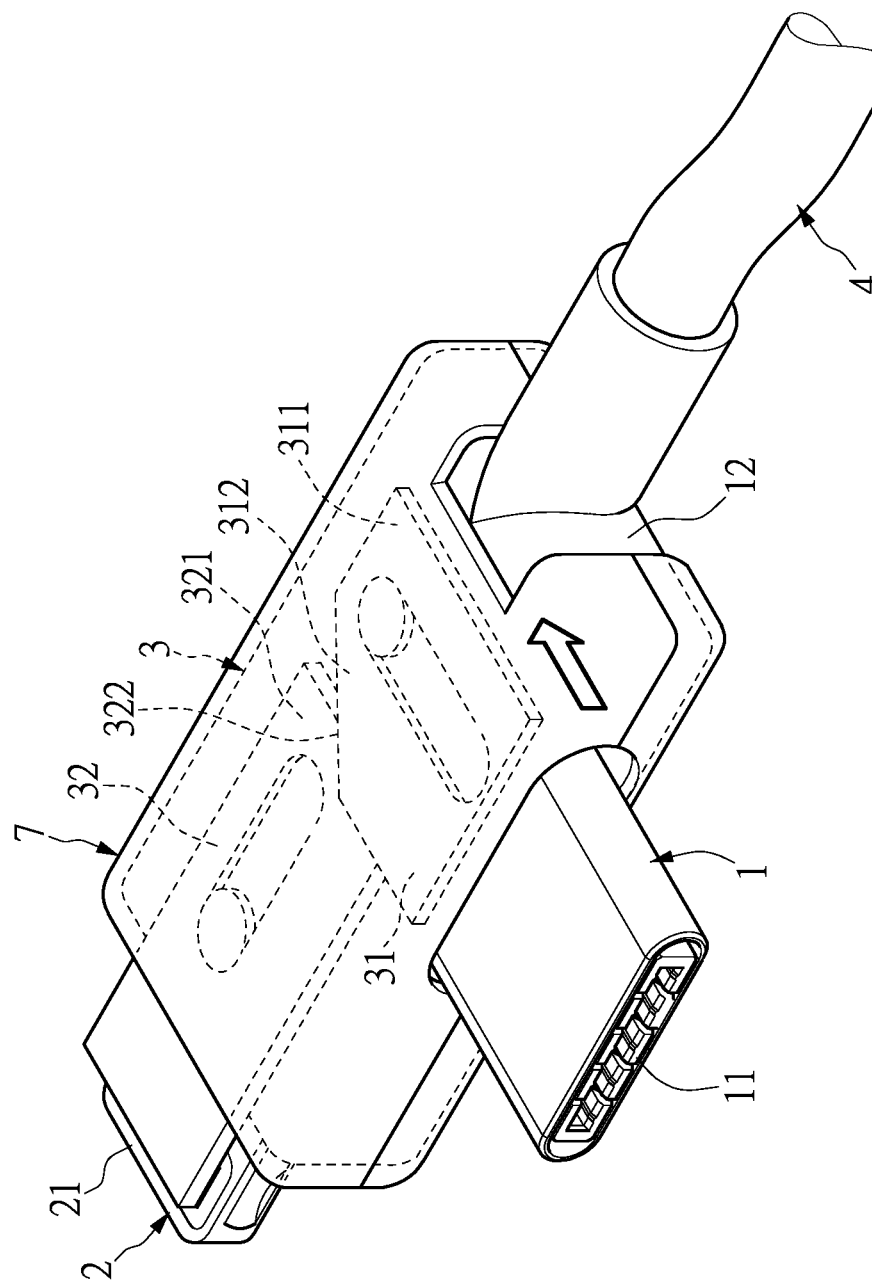
FIG. 19 is a schematic view of a use state (a) of the connecting device according to the seventh embodiment of the present disclosure.

As shown in FIG. 19, when the first shell 31 of the outer housing assembly 3 moves toward the second connector 2, the first shell 31 can push and contact the second inclined plane 322 of the second shell 32 by the first inclined plane 312 of the first shell 31 so that the second shell 32 is pushed and covers the outside of the second plugging terminal 21 of the second connector 2. Accordingly, the second plugging terminal 21 of the second connector 2 is inoperable. At this time, the first plugging terminal 11 of the first connector 1 extends out of the outer housing assembly 3 so that the first plugging terminal 11 of the first connector 1 is operable.

Figure 20:
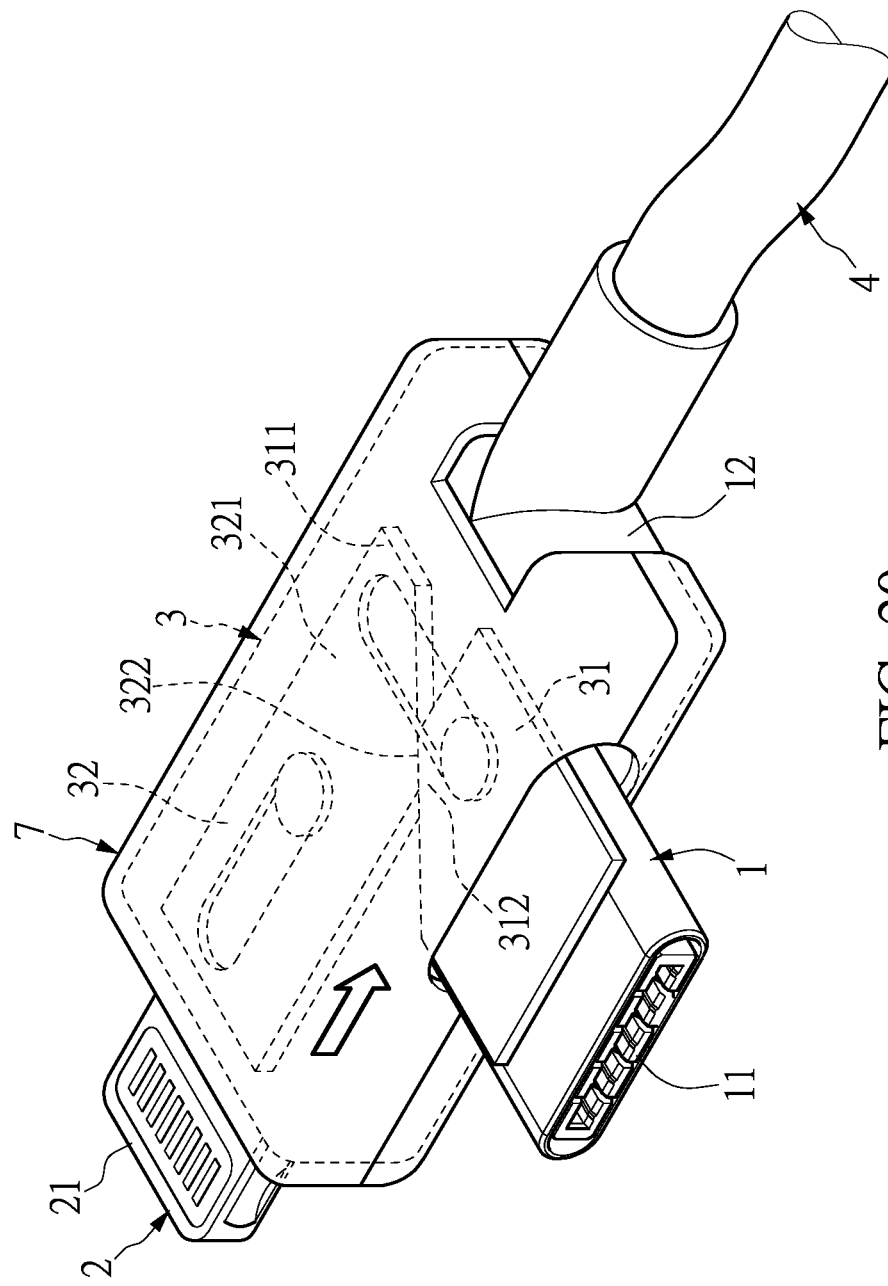
FIG. 20 is a schematic view of a use state (b) of the connecting device according to the seventh embodiment of the present disclosure.

As shown in FIG. 20, when the second shell 32 of the outer housing assembly 3 moves toward the first connector 1, the second shell 32 can push and contact the first inclined plane 312 of the first shell 31 by the second inclined plane 322 of the second shell 32 so that the first shell 31 is pushed and covers the outside of the first plugging terminal 11 of the first connector 1. Accordingly, the first plugging terminal 11 of the first connector 1 is inoperable. At this time, the second plugging terminal 21 of the second connector 2 extends out of the outer housing assembly 3 so that the second plugging terminal 21 of the second connector 2 is operable.

Eighth Embodiment

Figure 21:
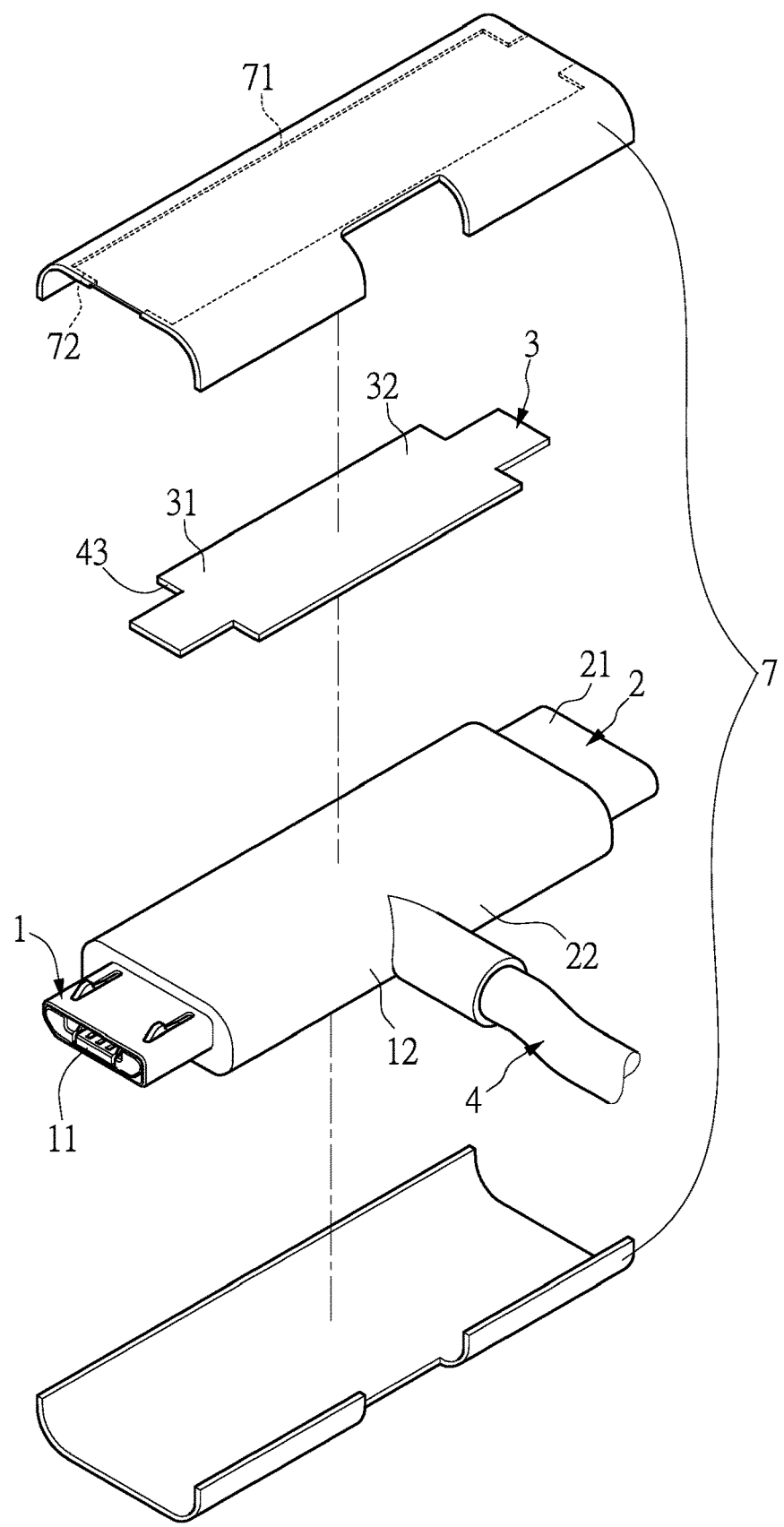
FIG. 21 is an exploded perspective view of the connecting device according to an eighth embodiment of the present disclosure.

Referring to FIG. 21, the structure and the operation of this embodiment are substantially the same as the sixth embodiment. The multiplex connecting device further includes an outer covering shell 7 sleeved outside of the outer housing assembly 3 to position the outer housing assembly 3. In addition, the multiplex connecting device further includes a guiding mechanism disposed between the outer housing assembly 3 and the outer covering shell 7, so as to guide and restrict the movement of the outer housing assembly 3 on the first connector 1 and the second connector 2. The guiding mechanism includes a guiding groove 71 disposed inside of the outer covering shell 7. The outer housing assembly 3 is slidably fitted into the guiding groove 71 to guide the movement of the outer housing assembly 3 on the first connector 1 and the second connector 2. The outer housing assembly 3 has shoulders 43 at both ends of the outer housing assembly 3, and two ends of the guiding groove 71 of the outer covering shell 7 respectively have stopping ends 72. When the outer housing assembly 3 slides within the guiding groove 71, the shoulders 43 of the outer covering shell 7 and the stopping ends 72 can be in contact with each other to be fixed in position.

Ninth Embodiment

Figure 22:
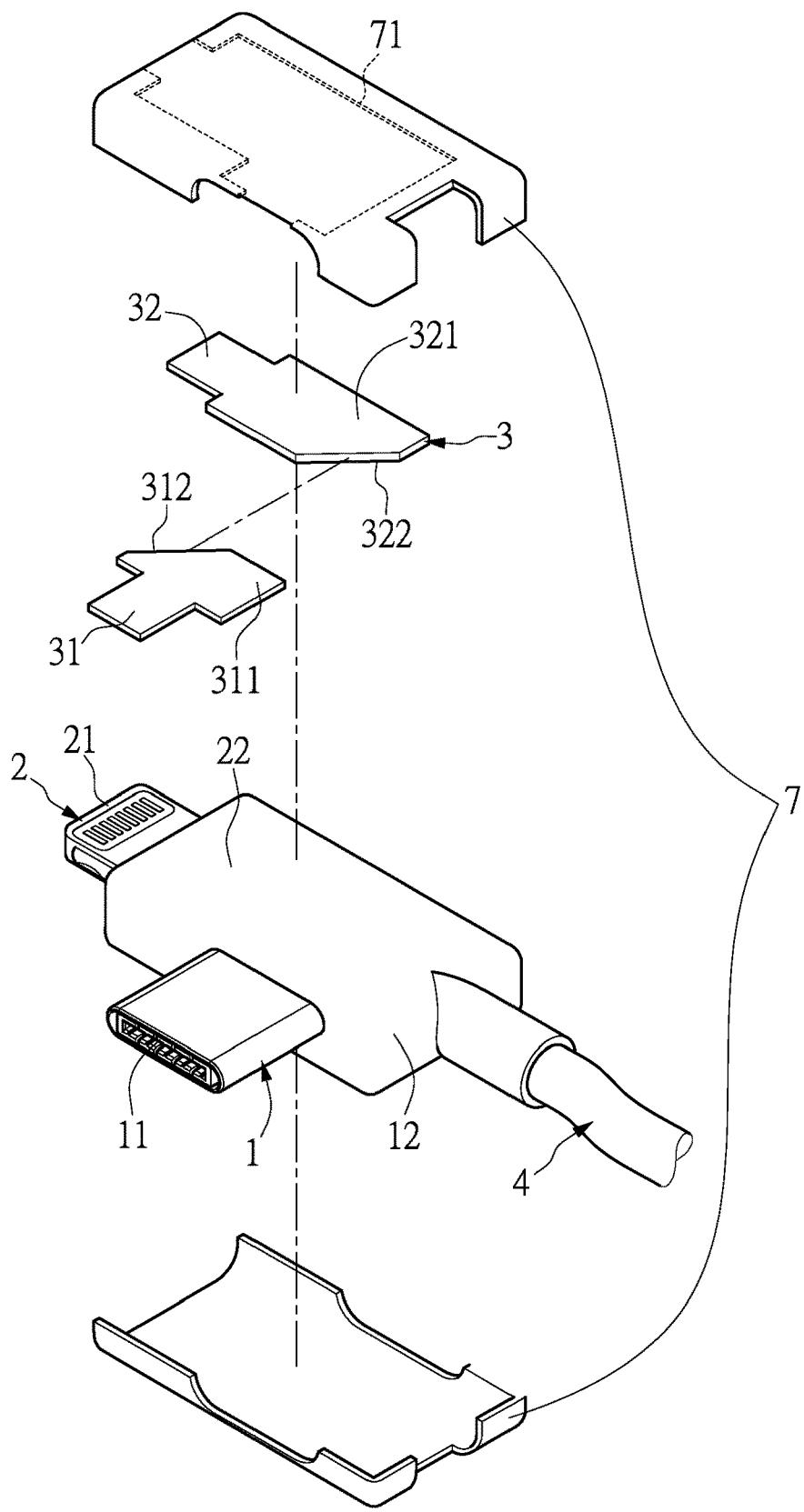
FIG. 22 is an exploded perspective view of the connecting device according to a ninth embodiment of the present disclosure.

Referring to FIG. 22, in this embodiment, the multiplex connecting device further includes an outer covering shell 7 sleeved on the outer housing assembly 3 to position the outer housing assembly 3. In addition, the multiplex connecting device further includes a guiding mechanism disposed between the outer housing assembly 3 and the outer covering shell 7, so as to guide and restrict the movement of the outer housing assembly 3 on the first connector 1 and the second connector 2. The guiding mechanism can include a guiding groove 71 disposed outside of the outer covering shell 7. The outer housing assembly 3 is slidably fitted into the guiding groove 71 to guide the movement of the outer housing assembly 3 on the first connector 1 and the second connector 2. The stop positioning structure of the outer housing assembly 3 is substantially the same as the eighth embodiment, and will not be reiterated herein.

Tenth Embodiment

Figure 23:
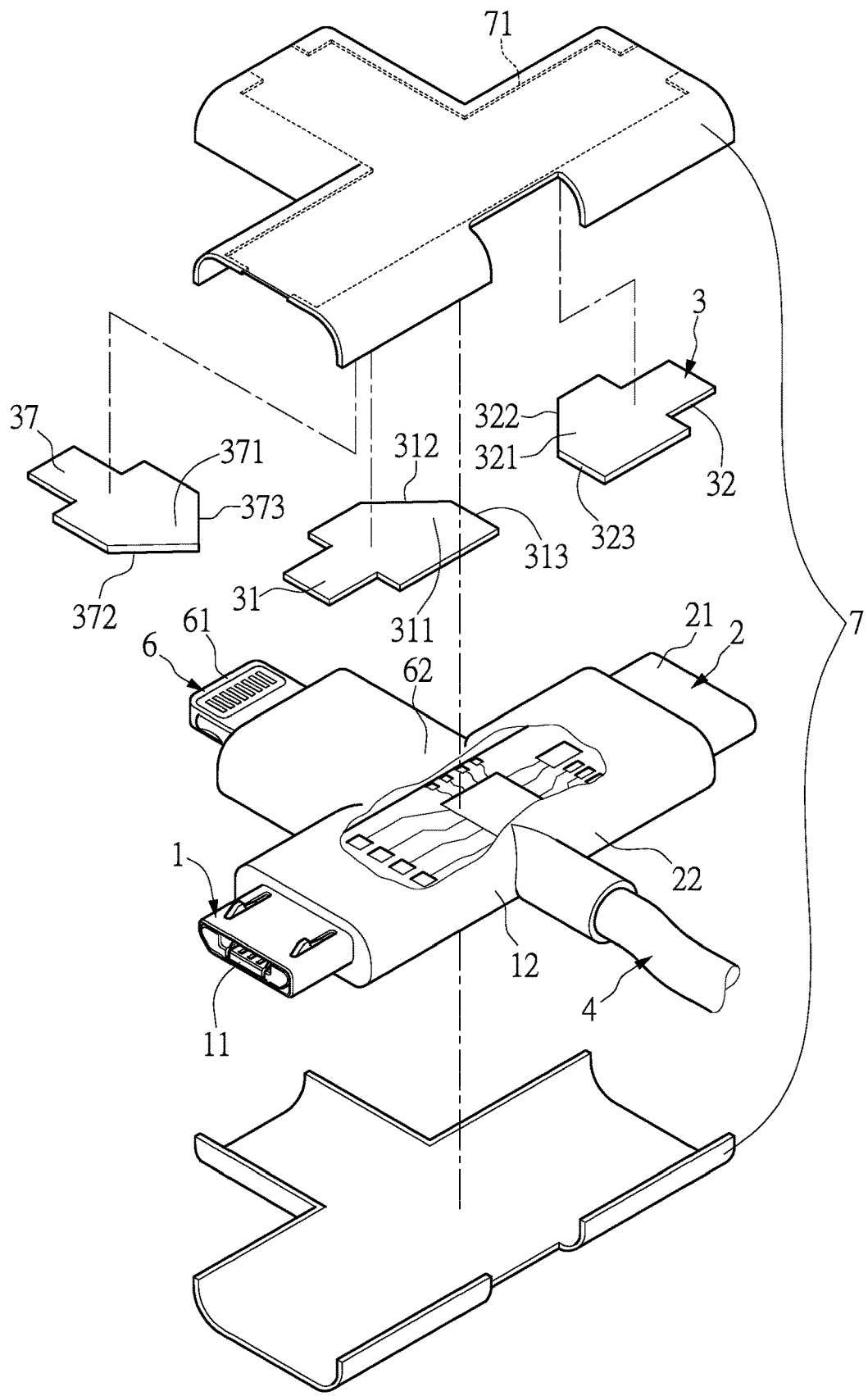
FIG. 23 is an exploded perspective view of the connecting device according to a tenth embodiment of the present disclosure.

Referring to FIG. 23, in this embodiment, the multiplex connecting device further includes an outer covering shell 7 sleeved outside of the outer housing assembly 3 to position the outer housing assembly 3. In addition, the multiplex connecting device further includes a guiding mechanism disposed between the outer housing assembly 3 and the outer covering shell 7, so as to guide and restrict the movement of outer housing assembly 3 on the first connector 1, the second connector 2, and the third connector 6. The guiding mechanism can include a guiding groove 71 disposed inside of the outer covering shell 7. The outer housing assembly 3 is slidably fitted into the guiding groove 71 to guide the movement of the outer housing assembly 3 on the first connector 1, the second connector 2, and the third connector 6. The stop positioning structure of the outer housing assembly 3 is substantially the same as the eighth embodiment, and will not be reiterated herein.

Eleventh Embodiment

Figure 24:
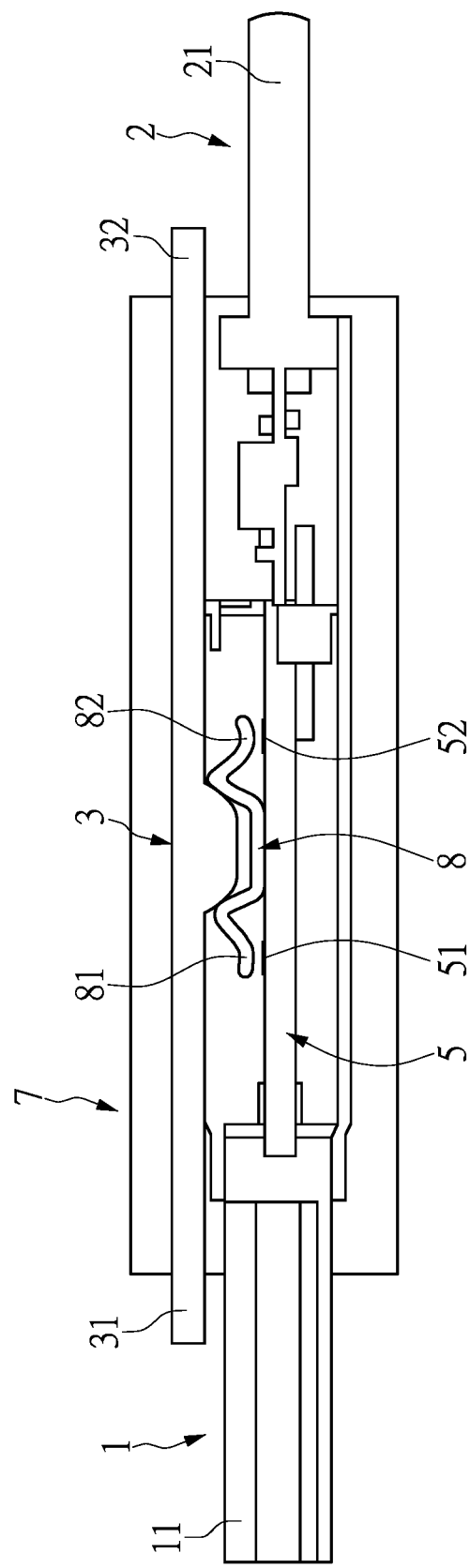
FIG. 24 is a schematic view of a local structure of the connecting device according to an eleventh embodiment of the present disclosure.

Referring to FIG. 24, in the present embodiment, the first shell 31 and the second shell 32 of the outer housing assembly 3 are respectively disposed outside of the first connector 1 and the second connector 2, and the outer housing assembly 3 tightly contacts the first connector 1 and the second connector 2. The outer housing assembly 3 can move on the first connector 1 and the second connector 2, so as to switch to a single connector (one of the first connector 1 and the second connector 2).

The first connector 1 and the second connector 2 can be electrically connected to the cable 4 through the circuit board 5 (not shown in FIG. 24). A conductive shrapnel 8 is disposed on the circuit board 5, and the conductive shrapnel 8 includes a first contact portion 81 and a second contact portion 82. The circuit board 5 includes a first contact point 51 and a second contact point 52. When the outer housing assembly 3 moves, the outer housing assembly 3 can selectively push the first contact portion 81 so that the first contact portion 81 contacts the first contact point 51, or the outer housing assembly 3 can selectively push the second contact portion 82 so that the second contact portion 82 contacts the second contact point 52. Accordingly, when the first plugging terminal 11 of the first connector 1 extends out of the first shell 31 of the outer housing assembly 3, the first contact portion 81 of the conductive shrapnel 8 and the first contact point 51 of the circuit board 5 are in a conductive state. Accordingly, when the second plugging terminal 21 of the second connector 2 extends out of the second shell 32 of the outer housing assembly 3, the second contact portion 82 of the conductive shrapnel 8 and the second contact point 52 of the circuit board 5 are in the conductive state. Accordingly, when the first plugging terminal 11 of the first connector 1 withdraws the first shell 31 of the outer housing assembly 3, the first contact portion 81 of the conductive shrapnel 8 and the first contact point 51 of the circuit board 5 are in a closed state. Accordingly, when the second plugging terminal 21 of the second connector 2 withdraws the second shell 32 of the outer housing assembly 3, the second contact portion 82 of the conductive shrapnel 8 and the second contact point 52 of the circuit board 5 are in the closed state. Furthermore, the conductive shrapnel 8 can also be disposed on the outer housing assembly 3, and the conductive shrapnel 8 can move with the outer housing assembly 3 to control the closed and conductive state of the first plugging terminal 11 of the first connector 1 and the second plugging terminal 21 of the second connector 2.

Twelfth Embodiment

Figure 25:
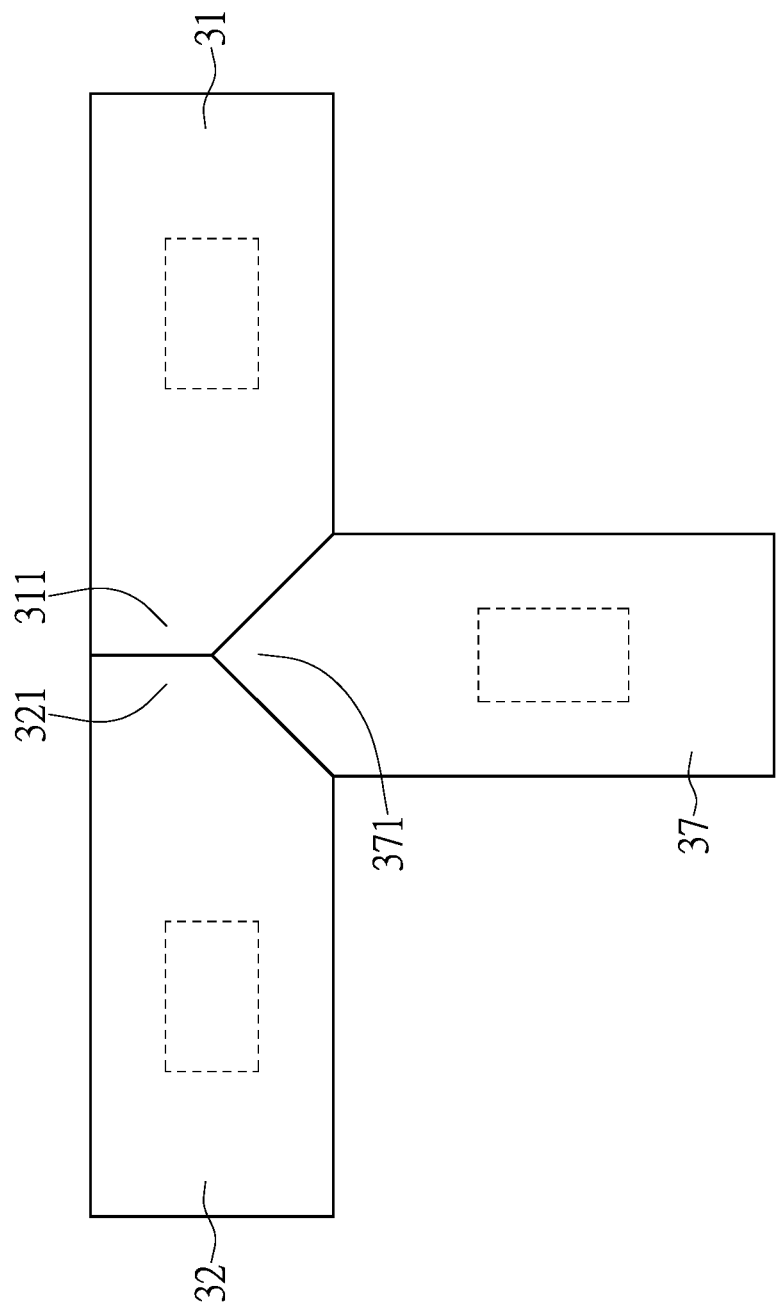
FIG. 25 is a schematic view of a local structure of the connecting device according to a twelfth embodiment of the present disclosure.

Referring to FIG. 25, in the present embodiment, the outer housing assembly 3 includes a first shell 31, a second shell 32, and a third shell 37. The first shell 31, the second shell 32, and the third shell 37 are respectively disposed (sleeved) outside of the first connector 1, the second connector 2, and the third connector 6 (as shown in FIG. 14). The outer housing assembly 3 can move on the first connector 1, the second connector 2, and the third connector 6, so as to switch to a single connector (one of the first connector 1, the second connector 2, and the third connector 6).

The first connector 1, the second connector 2, and the third connector 6 can be electrically connected to the cable (not shown in FIG. 25) through the circuit board. A conductive shrapnel (not shown in FIG. 25) can also be disposed on the circuit board, and the conductive shrapnel includes a first contact portion, a second contact portion, and a third contact portion (not shown in FIG. 25). The circuit board includes a first contact point, a second contact point, and a third contact point (not shown in FIG. 25). When the outer housing assembly 3 moves, the outer housing assembly 3 can selectively push the first contact portion so that the first contact portion contacts the first contact point, the outer housing assembly 3 can selectively push the second contact portion so that the second contact portion contacts the second contact point, or the outer housing assembly 3 can selectively push the third contact portion so that the third contact portion contacts the third contact point. Accordingly, when the first plugging terminal 11 of the first connector 1 extends out of the first shell 31 of the outer housing assembly 3, the first contact portion 81 of the conductive shrapnel 8 and the first contact point 51 of the circuit board 5 are in the conductive state. Accordingly, when the second plugging terminal 21 of the second connector 2 extends out of the second shell 32 of the outer housing assembly 3, the second contact portion 82 of the conductive shrapnel 8 and the second contact point 52 of the circuit board 5 are in the conductive state. Accordingly, when the first plugging terminal 61 of the third connector 6 extends out of the third shell 37 of the outer housing assembly 3, the third contact portion 83 of the conductive shrapnel 8 and the third contact point 53 of the circuit board 5 are in the conductive state.

In conclusion, the connecting device of the present disclosure integrates multiple connectors into one component so that a user can choose between the connectors by moving the outer housing assembly, and negative effects can therefore be prevented.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A multiplex connecting device capable of switching to a single connector, comprising:
    a first connector including a first plugging terminal and a first connecting terminal;
    a second connector including a second plugging terminal and a second connecting terminal, wherein the first connecting terminal of the first connector and the second connecting terminal of the second connector are connected to each other;
    an outer housing assembly including a first shell and a second shell, wherein the first shell and the second shell are in contact with each other or integrated into one component, wherein the first shell and the second shell are respectively disposed outside of the first connector and the second connector, and the outer housing assembly is capable of moving on the first connector and the second connector; and
    a guiding mechanism disposed between the first connector, the second connector, and the outer housing assembly, wherein the guiding mechanism is configured to guide and limit a movement of the outer housing assembly on the first connector and the second connector;
    wherein when the outer housing assembly moves toward the second connector, the second shell of the outer housing assembly covers an outside of the second plugging terminal of the second connector so that the second plugging terminal of the second connector is inoperable, and the first plugging terminal of the first connector extends out of the first shell of the outer housing assembly so that the first plugging terminal of the first connector is operable;
    wherein when the outer housing assembly moves toward the first connector, the first shell of the outer housing assembly covers an outside of the first plugging terminal of the first connector so that the first plugging terminal of the first connector is inoperable, and the second plugging terminal of the second connector extends out of the second shell of the outer housing assembly so that the second plugging terminal of the second connector is operable;
    wherein the multiplex connecting device further comprising a first guiding block and a second guiding block respectively disposed on the first connector and the second connector, and a first guiding groove and a second guiding groove disposed on the outer housing assembly, wherein the first guiding block and the second guiding block are slidably fitted into the first guiding groove and the second guiding groove, respectively, so as to form the guiding mechanism.

2. The multiplex connecting device according to claim 1, wherein a plugging direction of the first connector and a plugging direction of the second connector are located along a same straight line.

3. The multiplex connecting device according to claim 1, wherein a plugging direction of the first connector and a plugging direction of the second connector are perpendicular to each other.

4. A multiplex connecting device capable of switching to a single connector, comprising:
    a first connector including a first plugging terminal and a first connecting terminal;
    a second connector including a second plugging terminal and a second connecting terminal;
    a third connector including a third plugging terminal and a third connecting terminal, wherein the third connecting terminal of the third connector connects to the first connecting terminal of the first connector and the second connecting terminal of the second connector; and
    an outer housing assembly including a first shell, a second shell, and a third shell, wherein the first shell, the second shell, and the third shell are respectively disposed outside of the first connector, the second connector, and the third connector, and the outer housing assembly is capable of moving on the first connector, the second connector, and the third connector;
    wherein adjacent ends of the first shell, the second shell, and the third shell respectively have a first interlocking end, a second interlocking end, and a third interlocking end; the first interlocking end, the second interlocking end, and the third interlocking end are in contact with each other, wherein when the first shell of the outer housing assembly moves toward the second connector, the third shell and the second shell are pushed to respectively cover an outside of the third plugging terminal of the third connector and the second plugging terminal of the second connector so that the third plugging terminal of the third connector and the second plugging terminal of the second connector is inoperable, and the first plugging terminal of the first connector extends out of the first shell of the outer housing assembly so that the first plugging terminal of the first connector is operable;

wherein when the second shell of the outer housing assembly moves toward the first connector, the third shell and the first shell are pushed to respectively cover the outside of the third plugging terminal of the third connector and the first plugging terminal of the first connector so that the third plugging terminal of the third connector and the first plugging terminal of the first connector is inoperable, and the second plugging terminal of the second connector extends out of the second shell of the outer housing assembly so that the second plugging terminal of the second connector is operable;

wherein when the third shell of the outer housing assembly moves toward the first connector and the second connector, the first shell and the second shell are pushed to respectively cover an outside of the first plugging terminal of the first connector and the second plugging terminal of the second connector so that the first plugging terminal of the first connector and the second plugging terminal of the second connector are inoperable, and the third plugging terminal of the third connector extends out of the third shell of the outer housing assembly so that the third plugging terminal of the third connector is operable.

5. The multiplex connecting device according to claim 4, wherein a plugging direction of the first connector and a plugging direction of the second connector are located along a same straight line, wherein a plugging direction of the third connector is perpendicular to the plugging direction of the first connector and the plugging direction of the second connector.

6. The multiplex connecting device according to claim 4, wherein the first interlocking end has a first inclined plane and a first plane, wherein the second interlocking end has a second inclined plane and a second plane, and the third interlocking end has a third inclined plane and a fourth inclined plane, wherein the first inclined plane of the first interlocking end and the second inclined plane of the second interlocking end are capable of being respectively in contact with the third inclined plane and the fourth inclined plane of the third interlocking end;

wherein when the first shell of the outer housing assembly moves toward the second connector, the first shell pushes and contacts the third inclined plane of the third connector and the second plane of the second connector by the first inclined plane and the first plane, respectively, so that the third shell and the second shell respectively cover the outside of the third plugging terminal of the third connector and the second plugging terminal of the second connector;

wherein when the second shell of the outer housing assembly moves toward the first connector, the second shell respectively pushes and contacts the fourth inclined plane of the third connector and the first plane of the first connector by the second inclined plane and the second plane, respectively, so that the third shell and the first shell respectively cover the outside of the third plugging terminal of the third connector and the first plugging terminal of the first connector; and wherein when the third shell of the outer housing assembly moves toward the first connector and the second connector, the third shell pushes and contacts the first inclined plane of the first connector and the second inclined plane of the second connector by the third inclined plane and the third plane, respectively, so that the first shell and the second shell respectively cover the outside of the first plugging terminal of the first connector and the second plugging terminal of the second connector.

7. The multiplex connecting device according to claim 4, further comprising a guiding mechanism disposed between the first connector, the second connector, the third connector, and the outer housing assembly, and is configured to guide and limit the movement of the outer housing assembly on the first connector, the second connector, and the third connector.

8. A multiplex connecting device capable of switching to a single connector, comprising:
 a first connector including a first plugging terminal and a first connecting terminal;
 a second connector including a second plugging terminal and a second connecting terminal;
 a third connector including a third plugging terminal and a third connecting terminal, wherein the third connecting terminal of the third connector connects to the first connecting terminal of the first connector and the second connecting terminal of the second connector;
 an outer housing assembly including a first shell, a second shell, and a third shell, wherein the first shell, the second shell, and the third shell are respectively disposed outside of the first connector, the second connector, and the third connector, and the outer housing assembly is capable of moving on the first connector, the second connector, and the third connector;
 wherein when the first shell of the outer housing assembly moves toward the second connector, the third shell and the second shell are pushed to respectively cover an outside of the third plugging terminal of the third connector and the second plugging terminal of the second connector so that the third plugging terminal of the third connector and the second plugging terminal of the second connector is inoperable, and the first plugging terminal of the first connector extends out of the first shell of the outer housing assembly so that the first plugging terminal of the first connector is operable;
 wherein when the second shell of the outer housing assembly moves toward the first connector, the third shell and the first shell are pushed to respectively cover the outside of the third plugging terminal of the third connector and the first plugging terminal of the first connector so that the third plugging terminal of the third connector and the first plugging terminal of the first connector is inoperable, and the second plugging terminal of the second connector extends out of the second shell of the outer housing assembly so that the second plugging terminal of the second connector is operable; and
 wherein when the third shell of the outer housing assembly moves toward the first connector and the second connector, the first shell and the second shell are pushed to respectively cover an outside of the first plugging terminal of the first connector and the second plugging terminal of the second connector so that the first plugging terminal of the first connector and the second plugging terminal of the second connector are inoperable, and the third plugging terminal of the third connector extends out of the third shell of the outer housing assembly so that the third plugging terminal of the third connector is operable.

9. The multiplex connecting device according to claim 8, wherein a plugging direction of the first connector and a plugging direction of the second connector are located along a same straight line, and a plugging direction of the third connector is perpendicular to the plugging direction of the first connector and the plugging direction of the second connector.

10. The multiplex connecting device according to claim 8, further comprising a guiding mechanism disposed between the first connector, the second connector, and the outer housing assembly, and configured to guide and limit the movement of the outer housing assembly on the first connector, the second connector, and the third connector.

11. A multiplex connecting device capable of switching to a single connector, comprising:
   a first connector including a first plugging terminal and a first connecting terminal;
   a second connector including a second plugging terminal and a second connecting terminal, wherein the first connecting terminal of the first connector and the second connecting terminal of the second connector are connected to each other; and
   an outer housing assembly including a first shell and a second shell, wherein the first shell and the second shell are in contact with each other or integrated into one component, wherein the first shell and the second shell are respectively disposed outside of the first connector and the second connector, and the outer housing assembly is capable of moving on the first connector and the second connector;
   wherein when the outer housing assembly moves toward the second connector, the second shell of the outer housing assembly covers an outside of the second plugging terminal of the second connector so that the second plugging terminal of the second connector is inoperable, and the first plugging terminal of the first connector extends out of the first shell of the outer housing assembly so that the first plugging terminal of the first connector is operable;
   wherein when the outer housing assembly moves toward the first connector, the first shell of the outer housing assembly covers an outside of the first plugging terminal of the first connector so that the first plugging terminal of the first connector is inoperable, and the second plugging terminal of the second connector extends out of the second shell of the outer housing assembly so that the second plugging terminal of the second connector is operable; and
   wherein the multiplex connecting device further comprising a first stopping end and a second stopping end formed inside of the outer housing assembly, and a first convex portion and a second convex portion respectively disposed on the first connector and the second connector, wherein when the outer housing assembly moves toward the second connector, the first convex portion and the first stopping end are in contact with each other to be fixed in position, and wherein when the outer housing assembly moves toward the first connector, the second convex portion and the second stopping end are in contact with each other to be fixed in position.

12. A multiplex connecting device capable of switching to a single connector, comprising:
   a first connector including a first plugging terminal and a first connecting terminal;
   a second connector including a second plugging terminal and a second connecting terminal, wherein the first connecting terminal of the first connector and the second connecting terminal of the second connector are connected to each other; and
   an outer housing assembly including a first shell and a second shell, wherein the first shell and the second shell are in contact with each other or integrated into one component, wherein the first shell and the second shell are respectively disposed outside of the first connector and the second connector, and the outer housing assembly is capable of moving on the first connector and the second connector;
   wherein when the outer housing assembly moves toward the second connector, the second shell of the outer housing assembly covers an outside of the second plugging terminal of the second connector so that the second plugging terminal of the second connector is inoperable, and the first plugging terminal of the first connector extends out of the first shell of the outer housing assembly so that the first plugging terminal of the first connector is operable;
   wherein when the outer housing assembly moves toward the first connector, the first shell of the outer housing assembly covers an outside of the first plugging terminal of the first connector so that the first plugging terminal of the first connector is inoperable, and the second plugging terminal of the second connector extends out of the second shell of the outer housing assembly so that the second plugging terminal of the second connector is operable; and
   wherein the first connector and the second connector are electrically connected to a cable through a circuit board, and a conductive shrapnel disposed on the circuit board or the outer housing assembly includes a first contact portion and a second contact portion, wherein the circuit board includes a first contact point and a second contact point, wherein when the outer housing assembly moves, the outer housing assembly is able to selectively push the first contact portion so that the first contact portion contacts the first contact point, and the first plugging terminal of the first connector extends out of the first shell of the outer housing assembly to be in a conductive state, wherein when the outer housing assembly is able to selectively push the second contact portion so that the second contact portion contacts the second contact point, and the second plugging terminal of the second connector extends out of the second shell of the outer housing assembly to be in the conductive state, wherein the first plugging terminal of the first connector withdraws the first shell of the outer housing assembly to be in a closed state, and the second plugging terminal of the second connector withdraws the second shell of the outer housing assembly to be in the closed state.

\* \* \* \* \*